United States Patent
Wang

(10) Patent No.: US 10,447,209 B2
(45) Date of Patent: Oct. 15, 2019

(54) APPARATUS AND METHOD FOR IMPROVING EFFICIENCY OF POWER AMPLIFIER

(71) Applicant: Telefonaktiebolaget LM Ericsson (publ), Stockholm (SE)

(72) Inventor: Zhancang Wang, Beijing (CN)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 42 days.

(21) Appl. No.: 15/515,491

(22) PCT Filed: Jan. 26, 2017

(86) PCT No.: PCT/CN2017/072752
§ 371 (c)(1),
(2) Date: Mar. 29, 2017

(87) PCT Pub. No.: WO2018/137244
PCT Pub. Date: Aug. 2, 2018

(65) Prior Publication Data
US 2018/0241352 A1 Aug. 23, 2018

(51) Int. Cl.
*H03F 1/02* (2006.01)
*H03F 1/38* (2006.01)
(Continued)

(52) U.S. Cl.
CPC ......... *H03F 1/0288* (2013.01); *H03F 1/3205* (2013.01); *H03F 1/38* (2013.01);
(Continued)

(58) Field of Classification Search
USPC ........................ 330/149, 294, 302
See application file for complete search history.

(56) References Cited

U.S. PATENT DOCUMENTS 6,081,159 A * 6/2000 Kim ............... H03F 1/3205
330/149
6,433,632 B1 8/2002 Nakamura et al.
(Continued)

FOREIGN PATENT DOCUMENTS

CN 1675826 A 9/2005
CN 102801392 A 11/2012
(Continued)

OTHER PUBLICATIONS

PCT Notification of Transmittal of the International Search Report and the Written Opinion of the International Searching Authority, or the Declaration for International application No. PCT/CN2017/072752—dated Oct. 31, 2017.

*Primary Examiner* — Hieu P Nguyen
(74) *Attorney, Agent, or Firm* — Baker Botts, LLP

(57) ABSTRACT

Embodiments of the disclosure generally relate to a method and device for improving the efficiency of a power amplifier. The apparatus comprising: a harmonic generator, configured to generate one or more harmonic according to an output signal of a power amplifier; a harmonic feedback device, configured to inject the harmonic generated by the harmonic generator to an input terminal of the power amplifier; and a harmonic eliminator, configured to eliminate the harmonic in the output signal of the power amplifier. According to embodiments of the disclosure, the efficiency of power amplifier can be improved without degrading the linearity.

15 Claims, 19 Drawing Sheets

(51) Int. Cl.
  *H03F 3/21*    (2006.01)
  *H03F 1/56*    (2006.01)
  *H03F 3/195*   (2006.01)
  *H03F 3/213*   (2006.01)
  *H03F 1/32*    (2006.01)
  *H03F 3/193*   (2006.01)
  *H03F 3/24*    (2006.01)
  *H03F 3/60*    (2006.01)

(52) U.S. Cl.
  CPC ............... *H03F 1/56* (2013.01); *H03F 3/193* (2013.01); *H03F 3/195* (2013.01); *H03F 3/211* (2013.01); *H03F 3/213* (2013.01); *H03F 3/245* (2013.01); *H03F 3/602* (2013.01); *H03F 2200/06* (2013.01); *H03F 2200/09* (2013.01); *H03F 2200/102* (2013.01); *H03F 2200/129* (2013.01); *H03F 2200/138* (2013.01); *H03F 2200/222* (2013.01); *H03F 2200/267* (2013.01); *H03F 2200/378* (2013.01); *H03F 2200/387* (2013.01); *H03F 2200/405* (2013.01); *H03F 2200/408* (2013.01); *H03F 2200/451* (2013.01); *H03F 2200/465* (2013.01); *H03F 2200/534* (2013.01); *H03F 2200/537* (2013.01); *H03F 2200/541* (2013.01); *H03F 2200/546* (2013.01); *H03F 2203/21103* (2013.01); *H03F 2203/21139* (2013.01)

(56) References Cited

U.S. PATENT DOCUMENTS

| | | | |
|---|---|---|---|
| 7,061,317 B2* | 6/2006 | Petrovic | H03F 1/26 330/124 R |
| 7,656,229 B2* | 2/2010 | Deng | H03F 1/223 330/149 |
| 8,779,856 B2 | 7/2014 | Wilson et al. | |
| 9,431,969 B2 | 8/2016 | Jeon et al. | |
| 2014/0118070 A1 | 5/2014 | Wilson et al. | |
| 2014/0159818 A1 | 6/2014 | Jeon et al. | |
| 2015/0091653 A1 | 4/2015 | Kobayashi et al. | |

FOREIGN PATENT DOCUMENTS

| | | |
|---|---|---|
| CN | 104660176 A | 5/2015 |
| CN | 205545164 U | 8/2016 |
| EP | 2 983 291 A1 | 10/2016 |
| WO | WO2013174411 | 11/2013 |

\* cited by examiner (a)

(b)

2300 generating a controlling signal according to power envelope of an input signal of a Doherty power amplifier — 2301 tuning an impedance of an impedance tuner according to the controlling signal — 2302 compensating delay between the input signal and the controlling signal — 2303

APPARATUS AND METHOD FOR IMPROVING EFFICIENCY OF POWER AMPLIFIER

PRIORITY

This nonprovisional application is a U.S. National Stage Filing under 35 U.S.C. § 371 of International Patent Application Serial No. PCT/CN2017/072752 filed Jan. 26, 2017, and entitled "Apparatus And Method For Improving Efficiency Of Power Amplifier".

TECHNICAL FIELD

Embodiments of the present disclosure generally relate to the field of wireless communications, and more particularly, to an apparatus and method for improving efficiency of power amplifier.

BACKGROUND

This section introduces aspects that may facilitate better understanding of the present disclosure. Accordingly, the statements of this section are to be read in this light and are not to be understood as admissions about what is in the prior art or what is not in the prior art.

In cellular base stations of 4G and beyond, advanced digital modulation scheme is used for high spectrum efficiency. The radio frequency (RF) signal for 4G and beyond exhibits a large peak to average power ratio (PAPR), which is amplified simultaneously in a power amplifier (PA). Therefore, the instantaneous transmit power will vary very extensively and fast.

Conventionally, a Doherty PA is used to enhance amplification efficiency for high PAPR signal. However, with ever higher PAPR, the main difficulties in the Doherty PA are that Doherty region should be limited to maintain high efficiency with PAPR greater than a certain range, e.g. Doherty region should be limited so that the Doherty PA has output power back off with 6 dB.

A conventional Doherty PA comprises traditional amplifier units or cells that exhibit limited efficiency characteristics which defines the upper limit of the achievable efficiency of the Doherty PA. Various theories of operation of high efficiency amplifiers have been developed over the years to address the need for achieving high efficiency in amplifiers of Doherty PAs for high PAPR signal.

The conventional solution had maximum drain efficiencies exceeding 70%. However, low losses are particularly critical in the high power circuits where the dissipated power not only drains the power source but often substantially increases the junction temperature of the device. High operational temperatures thereby lead to lower performance and lower reliability of the Doherty PAs.

Harmonic injection method is a valid approach to boost amplifier cell peak power efficiency and efficiency around the peak power. In harmonic injection power amplifier, the harmonic is injected into the input terminal of the power amplifier, and efficiency of the power amplifier will increase to a certain extent. In prior art, the harmonic is usually generated and injected by active harmonic injection apparatus.

SUMMARY

The inventor found that the shortcomings mainly exist in the high cost and complexity of circuitry by using active harmonic injection method. Also the injected harmonic would degrade the linearity of the amplifier, and the power dissipation in harmonic generation circuitry degrades the overall efficiency to a certain extent. The high complexity of circuits also results in bulky equipment which may become an obstacle for product miniaturization.

In order to overcome at least part of the above problems, methods, apparatus are provided in the present disclosure. It can be appreciated that embodiments of the present disclosure are not limited to a power amplifiers, but could be more widely applied to any application scenario where similar problems exist.

Various embodiments of the present disclosure mainly aim at providing methods, devices and computer programs for improving efficiency of power amplifier. Other features and advantages of embodiments of the present disclosure will also be understood from the following description of specific embodiments when reading in conjunction with the accompanying drawings, which illustrate, by way of example, the principles of embodiments of the present disclosure.

In general, embodiments of the present disclosure provide a solution for improving efficiency of power amplifier.

In a first aspect, there is provided an apparatus for improving efficiency of power amplifier, the apparatus includes: a harmonic generator which is configured to generate one or more harmonic according to an output signal of a power amplifier; a harmonic feedback device which is configured to inject the harmonic generated by the harmonic generator to an input terminal of the power amplifier; and a harmonic eliminator which is configured to eliminate the harmonic in the output signal of the power amplifier.

In one embodiment, the harmonic generator is configured to generate even order harmonic according to the output signal of the power amplifier, the harmonic feedback device is configured to inject the even order harmonic generated by the harmonic generator to the input terminal of the power amplifier, and the harmonic eliminator is configured to eliminate the even order harmonics in the output signal of the power amplifier.

In one embodiment, the harmonic generator includes: a harmonic generating device which is configured to generate odd order harmonic and even order harmonic according to the output signal of the power amplifier; an output matching network which is configured to open the even order harmonic and to short the odd order harmonic at the output terminal of the power amplifier; and an input matching network which is configured to open the even order harmonic and to short the odd order harmonic at the input terminal of the power amplifier.

In one embodiment, the harmonic generating device includes a nonlinear variable capacitor, the harmonic feedback device includes a linear capacitor, and the harmonic generating device is shunt to ground at the output terminal of the power amplifier, the harmonic feedback device couples a gate and a drain of a power transistor of the power amplifier.

In one embodiment, the harmonic generator includes a nonlinear capacitor Cds between a drain and a source of a power transistor of the power amplifier; the harmonic feedback device includes a capacitor Cgd between a gate and the drain of the power transistor of the power amplifier; and the harmonic eliminator includes a differential to single end network.

In one embodiment, the power amplifier is a Doherty amplifier, and the apparatus further includes: an impedance tuner controller which is configured to generate a controlling signal according to power envelope of an input signal of the Doherty power amplifier; an impedance tuner which is configured to connect to output terminal of a carrier amplifier of the Doherty power amplifier, and an impedance of the impedance tuner could be tuned according to the controlling signal; and a timing alignment device which is configured to compensate delay between the input signal and the controlling signal.

In one embodiment, the impedance tuner controller includes: a power detector which is configured to detect a level of the power; a waveform shaping device which is configured to generate a waveform of the controlling signal according to the level of the power; and a tuner driver amplifier which is configured to amplify the waveform and output the amplified controlling signal to the impedance tuner.

In one embodiment, a bandwidth of the tuner driver amplifier is at least 3 times of that of the power envelope of the input signal.

In one embodiment, the impedance tuner includes at least one varactor stack, an impedance of the impedance tuner could be tuned by adjusting a ratio of a reactance and a resistance of the varactor stack.

In one embodiment, the impedance tuner is arranged in series with the carrier amplifier, the position of the impedance tuner is arranged in one of following three types: a pre-tuning type, where a placement order is the carrier amplifier, the impedance tuner and the output matching network; a post-tuning type, where the order is the carrier amplifier, the output matching network and the impedance tuner; and an integrated tuning type, where the impedance tuner is incorporated into the elements of the output matching network.

In one embodiment, when power level of an output of the power amplifier is lower than a 1st threshold, the impedance of the impedance tuner is fixed at a first static value; when power level of the output of the power amplifier is higher than the 1st threshold and lower than a second threshold, the impedance of the impedance tuner is dynamically adjusted by the controlling signal according to optimum load impedance trajectory based on load pull measurements; when power level of the output of the power amplifier enters Doherty operation, the impedance of the impedance tuner is fixed at a second static value; when power level of the output of the power amplifier reaches a third threshold, the Doherty operation finishes and reach the maximum output power.

In a second aspect of the embodiments, there is provided a method of harmonic injection and elimination, the method includes: generating one or more harmonic according to an output signal of a power amplifier; injecting the harmonic to an input terminal of the power amplifier; and eliminating the harmonic in the output signal of the power amplifier.

In one embodiment, the generated harmonic is even order harmonic, the injected harmonic is even order harmonic, and the eliminated harmonic is even order harmonic.

In one embodiment, generating even order harmonic includes: generating odd order harmonic and even order harmonic according to the output signal of the power amplifier; opening the even order harmonic and shorting the odd order harmonic at the output terminal of the power amplifier; and opening the even order harmonic and shorting the odd order harmonic at the input terminal of the power amplifier.

In one embodiment, generating odd order harmonic and even order harmonic by using at least one nonlinear variable capacitor; and injecting the generated harmonic by using linear capacitor.

In one embodiment, the power amplifier is a Doherty power amplifier, the method further includes: generating a controlling signal according to power envelope of an input signal of the Doherty power amplifier; tuning an impedance of an impedance tuner according to the controlling signal dynamically; and compensating delay between the input signal and the controlling signal.

In one embodiment, generating controlling signal includes: detecting a level of the power; generating a waveform of the controlling signal according to the level of the power; amplifying the waveform and outputting the amplified controlling signal to the impedance tuner.

In one embodiment, the impedance tuner includes varactor stack, an impedance of the impedance tuner could be tuned by adjusting a ratio of a reactance and a resistance of the varactor stack.

In one embodiment, when power level of an output of the power amplifier is lower than the 1st threshold, the impedance of the impedance tuner is fixed at a first static value; when power level of the output of the power amplifier is higher than the 1st threshold and lower than the 2nd threshold, the impedance of the impedance tuner is adjusted by the controlling signal according to optimum load impedance trajectory based on load pull measurements; when power level of the output of the power amplifier enters Doherty operation, the impedance of the impedance tuner is fixed at a second static value; when power level of the output of the power amplifier reaches a third threshold, the Doherty operation finishes and reach the maximum output power.

In the third aspect of embodiment, there is provided an apparatus for improving efficiency of a Doherty power amplifier, the apparatus includes: an impedance tuner controller which is configured to generate a controlling signal according to power envelope of an input signal of a Doherty power amplifier; an impedance tuner which is configured to connect to output terminal of a carrier amplifier of the Doherty power amplifier, and an impedance of the impedance tuner can be tuned according to the controlling signal; and a timing alignment device which is configured to compensate delay between the input signal and the controlling signal.

In one embodiment, the impedance tuner controller includes: a power detector which is configured to detect a level of the power; a waveform shaping device which is configured to generate a waveform of the controlling signal according to the level of the power; a tuner driver amplifier which is configured to amplify the waveform and output the amplified controlling signal to the impedance tuner.

In one embodiment, a bandwidth of the tuner driver amplifier is at least 3 times of the power envelope of the input signal.

In one embodiment, the impedance tuner includes at least one varactor stack, an impedance of the impedance tuner could be tuned by adjusting the ratio of the reactance and resistance of the varactor stack.

In one embodiment, the impedance tuner is arranged in series with the carrier amplifier and an output matching network, the position of the impedance tuner is arranged in one of the following three types: a pre-tuning type, where a placement order is the carrier amplifier, the impedance tuner and the output matching network; a post-tuning type, where the order is the carrier amplifier, the output matching network and the impedance tuner; and an integrated tuning type, where the impedance tuner is incorporated into the elements of the output matching network.

In one embodiment, when power level of an output of the power amplifier is lower than a 1st threshold, the impedance of the impedance tuner is fixed at a first static value; when power level the power amplifier is higher than the 1st threshold and lower than a 2nd threshold, the impedance of the impedance tuner is adjusted by the controlling signal according to optimum load impedance trajectory based on load pull measurements; when power level of the output of the power amplifier enters Doherty operation, the impedance of the impedance tuner is fixed at a second static value; when power level of the output of the power amplifier reaches a third threshold, the Doherty operation finishes and reach the maximum output power.

In a fourth aspect of the embodiments, there is provided an method of impedance tuning for a Doherty power amplifier, the method includes: generating a controlling signal according to power envelope of an input signal of a Doherty power amplifier; tuning an impedance of an impedance tuner connecting to the output terminal of a carrier of the Doherty power amplifier according to the controlling signal; and compensating delay between the input signal and the controlling signal.

In one embodiment, generating controlling signal includes: detecting a level of the power; generating a waveform of the controlling signal according to the level of the power; amplifying the waveform and outputting the amplified controlling signal to the impedance tuner.

In one embodiment, when power level of an output of the power amplifier is lower than a 1st threshold, the impedance of the impedance tuner is fixed at a first static value; when power level of the output of the power amplifier is higher than the 1st threshold and lower than a 2nd threshold, the impedance of the impedance tuner is adjusted by the controlling signal according to optimum load impedance trajectory based on load pull measurements; when power level of the output of the power amplifier enters Doherty operation, the impedance of the impedance tuner is fixed at a second static value; when power level of the output of the power amplifier reaches a third threshold, the Doherty operation finishes and reach the maximum output power.

In a fifth aspect, a device is provided. The device includes: an apparatus as mentioned in the first aspect or third aspect of the present disclosure.

In a sixth aspect, an apparatus in a wireless communication system is provided. The apparatus comprise: at least one processor; and at least one memory comprising computer program code, the at least one memory and the computer program code configured to, with the at least one processor, cause the apparatus at least to: generate one or more harmonic according to an output signal of a power amplifier; inject the harmonic to an input terminal of the power amplifier; and eliminate the harmonic in the output signal of the power amplifier.

In a seventh aspect, an apparatus in a wireless communication system is provided. The apparatus comprise: at least one processor; and at least one memory comprising computer program code, the at least one memory and the computer program code configured to, with the at least one processor, cause the apparatus at least to: generate a controlling signal according to power envelope of an input signal of a Doherty power amplifier; tune an impedance of an impedance tuner connecting to an output terminal of a carrier of the Doherty power amplifier according to the controlling signal; and compensate delay between the input signal and the controlling signal.

According to various embodiments of the present disclosure, harmonic could be feedback to a power amplifier, and a harmonic elimination is performed for an output signal of the power amplifier. Therefore, the efficiency of power amplifier can be improved without degrading the linearity.

BRIEF DESCRIPTION OF THE DRAWINGS

The above and other aspects, features, and benefits of various embodiments of the disclosure will become more fully apparent, by way of example, from the following detailed description with reference to the accompanying drawings, in which like reference numerals or letters are used to designate like or equivalent elements. The drawings are illustrated for facilitating better understanding of the embodiments of the disclosure and not necessarily drawn to scale, in which:

FIG. 5 (b) illustrates the harmonic feedback efficiency when Cgd value is large;

FIG. 10 (b) illustrates PAE and LPP (Load Power Probability) versus the fundamental output power in accordance with an embodiment of the present disclosure;

DETAILED DESCRIPTION

Figure 1:
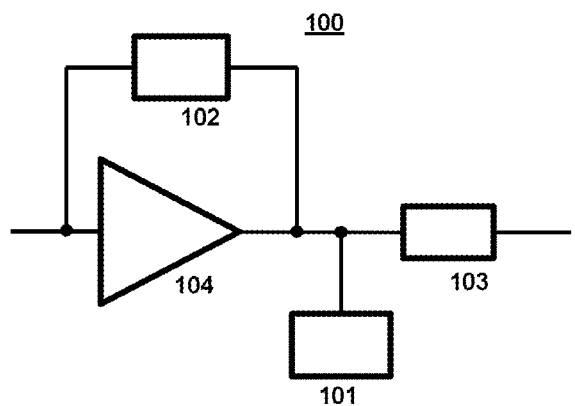
FIG. 1 is a diagram of an apparatus for improving efficiency of power amplifier in accordance with an embodiment of the present disclosure.

The present disclosure will now be discussed with reference to several example embodiments. It should be understood that these embodiments are discussed only for the purpose of enabling those skilled persons in the art to better understand and thus implement the present disclosure, rather than suggesting any limitations on the scope of the present disclosure.

As used herein, the term "wireless communication network" refers to a network following any suitable communication standards, such as LTE-Advanced (LTE-A), LTE, Wideband Code Division Multiple Access (WCDMA), High-Speed Packet Access (HSPA), and so on. Furthermore, the communications between a terminal device and a network device in the wireless communication network may be performed according to any suitable generation communication protocols, including, but not limited to, the first generation (1G), the second generation (2G), 2.5G, 2.75G, the third generation (3G), the fourth generation (4G), 4.5G, the future fifth generation (5G) communication protocols, and/or any other protocols either currently known or to be developed in the future.

The term "network device" refers to a device in a wireless communication network via which a terminal device accesses the network and receives services therefrom. The network device refers a base station (BS), an access point (AP), or any other suitable device in the wireless communication network. The BS may be, for example, a node B (NodeB or NB), an evolved NodeB (eNodeB or eNB), or gNB, a Remote Radio Unit (RRU), a radio header (RH), a remote radio head (RRH), a relay, a low power node such as a femto, a pico, and so forth.

Yet further examples of the network device may include multi-standard radio (MSR) radio equipment such as MSR BSs, network controllers such as radio network controllers (RNCs) or base station controllers (BSCs), base transceiver stations (BTSs), transmission points, transmission nodes. More generally, however, the network device may represent any suitable device (or group of devices) capable, configured, arranged, and/or operable to enable and/or provide a terminal device access to the wireless communication network or to provide some service to a terminal device that has accessed the wireless communication network. The network device may include an apparatus in an embodiment of the present disclosure.

The term "terminal device" refers to any end device that can access a wireless communication network and receive services therefrom. By way of example and not limitation, the terminal device refers to a mobile terminal, user equipment (UE), or other suitable devices. The UE may be, for example, a Subscriber Station (SS), a Portable Subscriber Station, a Mobile Station (MS), or an Access Terminal (AT). The terminal device may include, but not limited to, portable computers, image capture terminal devices such as digital cameras, gaming terminal devices, music storage and playback appliances, a mobile phone, a cellular phone, a smart phone, a tablet, a wearable device, a personal digital assistant (PDA), a vehicle, and the like. The terminal device may include the apparatus in the embodiment of the present disclosure.

As used herein, the terms "first" and "second" refer to different elements. The singular forms "a" and "an" are intended to include the plural forms as well, unless the context clearly indicates otherwise. The terms "comprises," "comprising," "has," "having," "includes" and/or "including" as used herein, specify the presence of stated features, elements, and/or components and the like, but do not preclude the presence or addition of one or more other features, elements, components and/or combinations thereof. The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below.

Before describing the examples illustratively depicted in the several figures, a general introduction is provided for further understanding.

The inventor found that the existing harmonic injection amplifier solutions have below problems:

1. Not design for Doherty PAs for high average efficiency with high PAPR signals;

2. The injected harmonics generated may degrade linearity and spectrum mask performance in product phase;

3. The active harmonic injection scheme requires very complex external harmonic generation, mixing up and feedback circuits which may cause higher cost, complexity, and printed circuit board (PCB) area;

4. The even order harmonics and intermodulations used for injection are not eliminated;

5. The odd order harmonic generated for high efficiency may trade off linearity and linearization difficulties;

6. Active harmonic injection cause potential power loss in auxiliary circuitry can degrade overall efficiency by harmonic injection.

The technical solution provided by present disclosure would solve part of the above problems by injecting harmonic into an input terminal of a power amplifier and eliminating the harmonic at an output terminal of the power amplifier. So that benefit of the harmonic would be used, and the drawbacks of the harmonic would be reduced.

With the above general understanding borne in mind, various exemplary embodiments of the present disclosure will be described below with reference to the figures.

First Aspect of Embodiments

An apparatus for improving efficiency of power amplifier is provided in one embodiment.

FIG. 1 shows a diagram of an apparatus for improving efficiency of power amplifier. As shown in FIG. 1, an apparatus 100 includes a harmonic generator 101, a harmonic feedback device 102, and a harmonic eliminator 103.

As shown in FIG. 1, the harmonic generator 101 is configured to generate one or more harmonic according to an output signal of a power amplifier 104; the harmonic feedback device 102 is configured to inject the harmonic generated by the harmonic generator 101 to an input terminal of the power amplifier 104; and the harmonic eliminator 103 is configured to eliminate the harmonic in the output signal of the power amplifier 104, where the intermodulation is caused by the harmonic mixing up.

According to the embodiment of the present disclosure, the harmonic could be feedback to the power amplifier, so as to improve the efficiency of the power amplifier. In addition, the harmonic and the intermodulation in the output signal is eliminated, so as to improve the linearity of the power amplifier is improved. Therefore, the efficiency of the power amplifier can be improved without degrading the linearity.

In one embodiment, the harmonic eliminator 103 could further eliminate an intermodulation in the output signal of the power amplifier 104, where the intermodulation is caused by the harmonic mixing up. Therefore, the linearity of the power amplifier could be further improved.

In one embodiment, the harmonic generator 101 is configured to generate even order harmonic according to the output signal of the power amplifier 104. The harmonic feedback device 102 is configured to inject the even order harmonic generated by the harmonic generator 101 to the input terminal of the power amplifier 104. The harmonic eliminator 103 is configured to eliminate the even order harmonic and the intermodulation in the output signal of the power amplifier 104.

Figure 2:
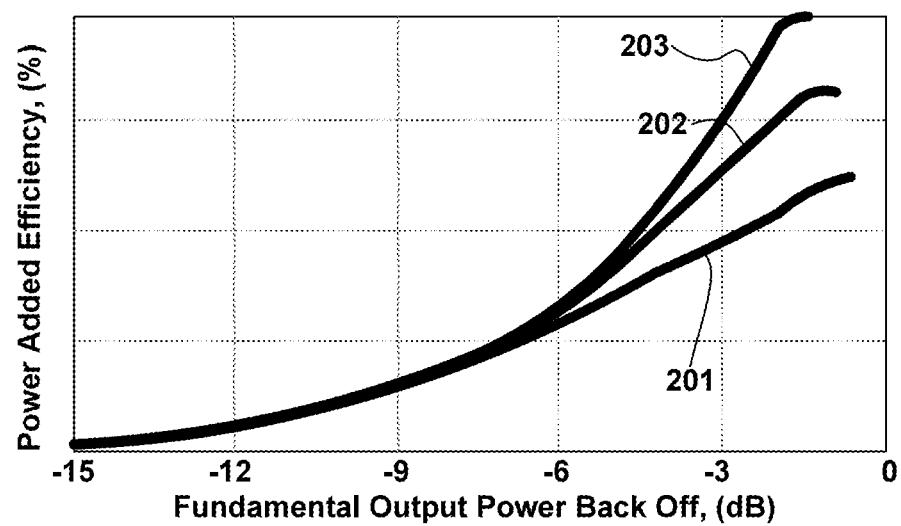
FIG. 2 is a diagram illustrating the embodiment to boost peak power efficiency of the power amplifier by using even order harmonic feedback to input for harmonic injection.

FIG. 2 shows an illustration of the embodiment to boost peak power efficiency of the power amplifier by using even order harmonic feedback to input for harmonic injection. As shown in FIG. 2, line 201 refers to the even order harmonic connecting to 50 Ohm impedance, line 202 refers to the even order harmonic connecting to open, line 203 refers to the even order harmonic feedback to input terminal for harmonic injection. Line 203 shows the improvement of power added efficiency (PAE) compared with line 202 and line 201.

Figure 3:
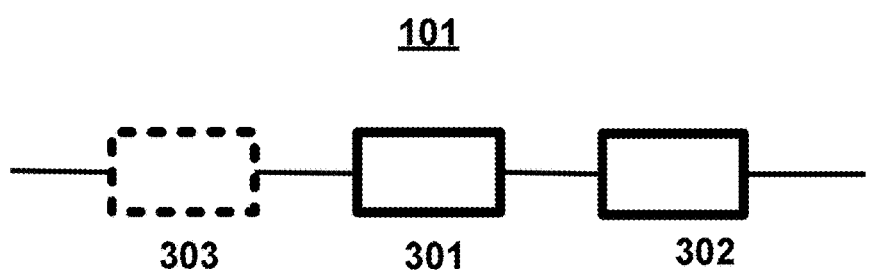
FIG. 3 is a diagram of the harmonic generator in accordance with an embodiment of the present disclosure.

FIG. 3 shows a diagram of the harmonic generator in one embodiment. As shown in FIG. 3, the harmonic generator 101 may include a harmonic generating device 301 and an output matching network 302.

In one embodiment, the harmonic generating device 301 is configured to generate odd order harmonic and even order harmonic according to the output signal of the power amplifier 104. The output matching network 302 is configured to open the even order harmonic and to short the odd order harmonic at the output terminal of the power amplifier 104.

In one embodiment, the harmonic generating device 301 may include a nonlinear variable capacitor. For example, the nonlinear variable capacitor could be a varactor or varactor stack. The nonlinear variable capacitor would benefit to generate odd order harmonic and even order harmonic at the output terminal of the power amplifier 104.

When the power amplifier 104 works in a class-$F^{-1}$ mode, the output terminal of the power amplifier 104 will connect to a harmonic controlling network to open the even order harmonic and to short the odd order harmonic. In one embodiment, the power amplifier 104 would be configured to work in the class-$F^{-1}$ mode, so that the harmonic controlling network used in the class-$F^{-1}$ mode would be used to implement the output matching network 302.

For the output matching network 302, the optimal load at fundamental frequency is determined by a load pull measurement. The output matching network 302 provides terminations for both even and odd harmonics. A low pass output matching is used with segments addressing for the even harmonic open and odd harmonic short at the drain terminal of the RF power device. Due to imperfect harmonic terminations in output matching network, it may produce even harmonic in voltage waveform as well as odd harmonic. However, the level should be controlled into a certain level.

As shown in FIG. 3, in one embodiment, the harmonic generator 101 may further include an input matching network 303. The input matching network 303 is configured to open the even order harmonic and to short the odd order harmonic at the input terminal of the power amplifier 104.

The input matching network 303 guarantees all odd order harmonic would be short to the ground, which would not have any residues to impact linearity performance after the harmonic elimination. Besides, the input matching network 303 would help to generate even harmonic at the input terminal of the power amplifier 104, which would further improve the efficiency of the power amplifier 104.

In one embodiment, the harmonic feedback device 102 may include a linear capacitor. The linear capacitor will generate less additional harmonic when feedback the harmonic generated by the harmonic generator 101. The linear capacitor should be large enough to feedback as much harmonic as possible to the input terminal of the power amplifier 104.

In one embodiment, the harmonic generating device 301 may be shunt to ground at the output terminal of the power amplifier 104, and the harmonic feedback device 104 may couple a gate and a drain of a power transistor of the power amplifier 104.

In one embodiment, the harmonic generating device 301 and the harmonic feedback device 102 may be implemented by external device out of the power amplifier 104.

In one embodiment, the harmonic generating device 301 and the harmonic feedback device 102 may be implemented by intrinsic capacitors of the power amplifier 104. For example, the harmonic generating device 301 maybe a capacitor Cds between a drain and a source of a power transistor of the power amplifier 104, and the harmonic feedback device 102 may be implemented by a capacitor Cgd between a gate and the drain of the power transistor of the power amplifier 104. Therefore, it is a quite simplified and efficient harmonic injection apparatus compared to prior art. No active components, no external device is needed. By only design of transistor level with the requirements, high efficiency harmonic injection could be achieved for the power amplifier.

In one embodiment, the capacitor Cds may be a nonlinear capacitor, and the capacitor Cgd may be an approximate linear capacitor.

Figure 4:
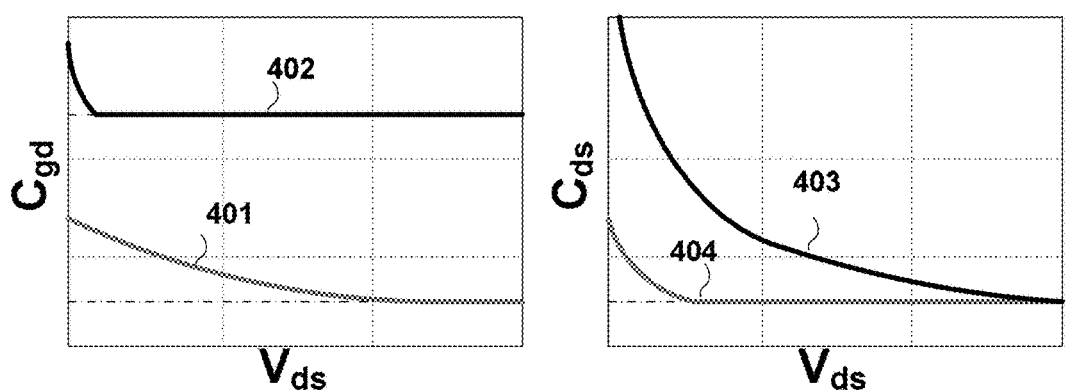
FIG. 4 is a diagram of characters of Cds and Cgd in present disclosure and the prior art.

FIG. 4 shows characters of Cds and Cgd in present disclosure and prior art. As shown in FIG. 4, line 402 shows that Cgd in the embodiment is linear, while line 401 shows that Cgd in the prior art is nonlinear. Line 404 shows that Cds in the prior art is linear, while line 403 shows that Cds in the embodiment is nonlinear.

Figure 5:
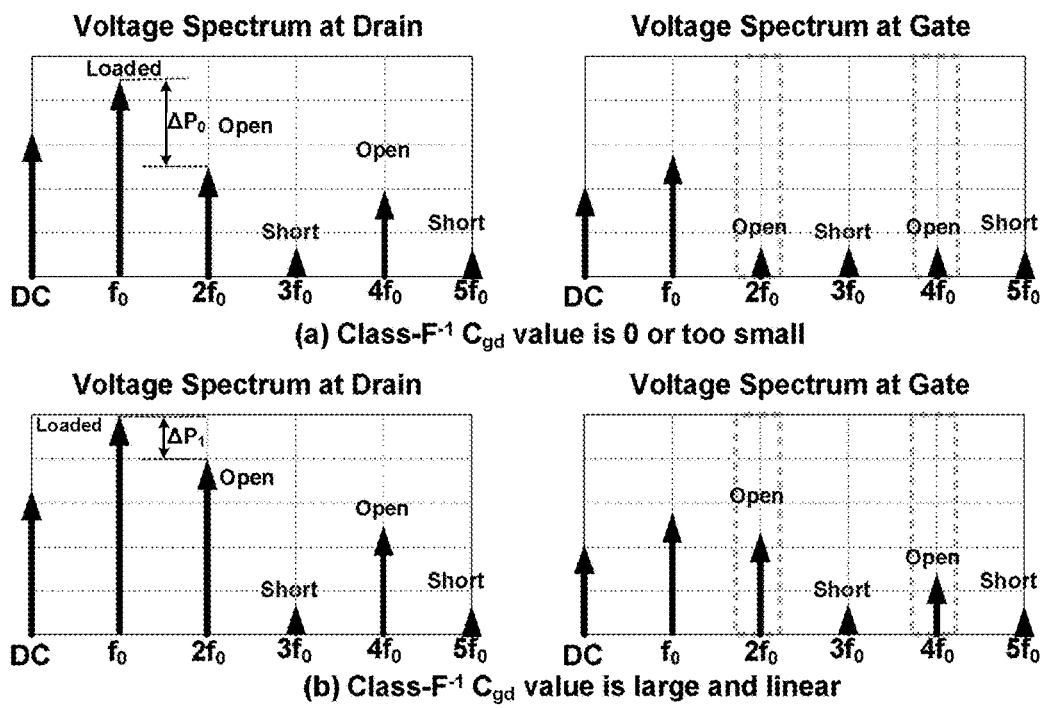
FIG. 5 (a) illustrates the harmonic feedback efficiency when Cgd value is 0 or too small.

In the embodiment, the capacitor Cgd should be large enough to feedback as much harmonic as possible to the input terminal of the power amplifier 104. FIG. 5 (*a*) shows the harmonic feedback efficiency when Cgd value is 0 or too small. FIG. 5 (*b*) shows the harmonic feedback efficiency when Cgd value is large and linear. As shown in FIG. 5 (*a*), under the situation that the power amplifier 104 works in the Class-$F^{-1}$ mode, when Cgd is unsatisfied, the even harmonics $2f_0$ and $4f_0$ is weak at gate and the power difference between $f_0$ and $2f_0$ is $\Delta P_0$. As shown in FIG. 5 (*b*), when Cgd is satisfied, the even harmonics $2f_0$ and $4f_0$ is strong at gate, so as the efficiency of the power amplifier 104 would be improved and the power difference between $f_0$ and $2f_0$ is $\Delta P_1$, $\Delta P_1$ is smaller than $\Delta P_0$. For example, a capacitance of the capacitor Cgd should be larger than 10 pf.

In one embodiment, the optimal load and source impedances at the fundamental frequency are obtained by using source pull and load pull measurements respectively. The odd harmonic matching segment in output matching network is made to compensate for the output reactance of the power device at the odd harmonic. The even harmonic matching segment in the output matching network 302 is optimized and modified so that the Cds varies to create different harmonic injection levels that are fed back to the gate.

In one embodiment, the input matching network 303 has higher order than the output matching network 302, providing both even and odd harmonic terminations at the gate. When the power device capacitance Cgs is linear, the only mechanism for generating harmonics at the gate is feedback from the output matching network 302 to the input matching network 303 via Cgd capacitance. The effect of feedback through Cgd can be observed by comparing the harmonic spectrums at the drain and gate, as shown in FIG. 4 and FIG. 5.

In one embodiment, the harmonic eliminator 103 may include a differential to single end network. For example, the differential to single end network could be implemented by a Balun device.

The present disclosure uses inherent even harmonic injection alone by shorting odd harmonic for termination to boost amplifier power added efficiency. Especially, the second harmonic open is most beneficial and the effect of the fourth harmonic termination is less significant, although some non-ideal odd harmonics may exist due to imperfect short termination. The gate to drain capacitance is targeting to build linear to avoid odd harmonic generation during a harmonic injection process.

In one embodiment, the apparatus 100 could combine with the power amplifier 104 to form a power amplifier equipment. The power amplifier 104 could be Doherty power amplifier or other type of power amplifier.

The present disclosure is not limited to any Doherty topologies. It is a systematic method to further increase efficiency based on existing Doherty PA performance. The feasible Doherty PA types are: normal Doherty, inverted Doherty, symmetric Doherty, asymmetric Doherty, uneven Doherty, parallel Doherty, serial Doherty, multi-way Doherty, multistage Doherty and Digital Doherty.

In present disclosure, a Doherty amplifier with multiharmonic input matching network is provided. Harmonic signal components at the gate come from several sources including nonlinear drain to source capacitance of RF power transistor and imperfect output harmonic terminations that create harmonic components that are fed back to the gate through the gate-drain capacitance. The effect of the harmonic generation mechanisms and the potential to shape the gate waveform improves power efficiency of both carrier and peaking amplifiers.

The present disclosure could use either LDMOS or GaN HEMT power devices to form the power amplifier.

Figure 6:
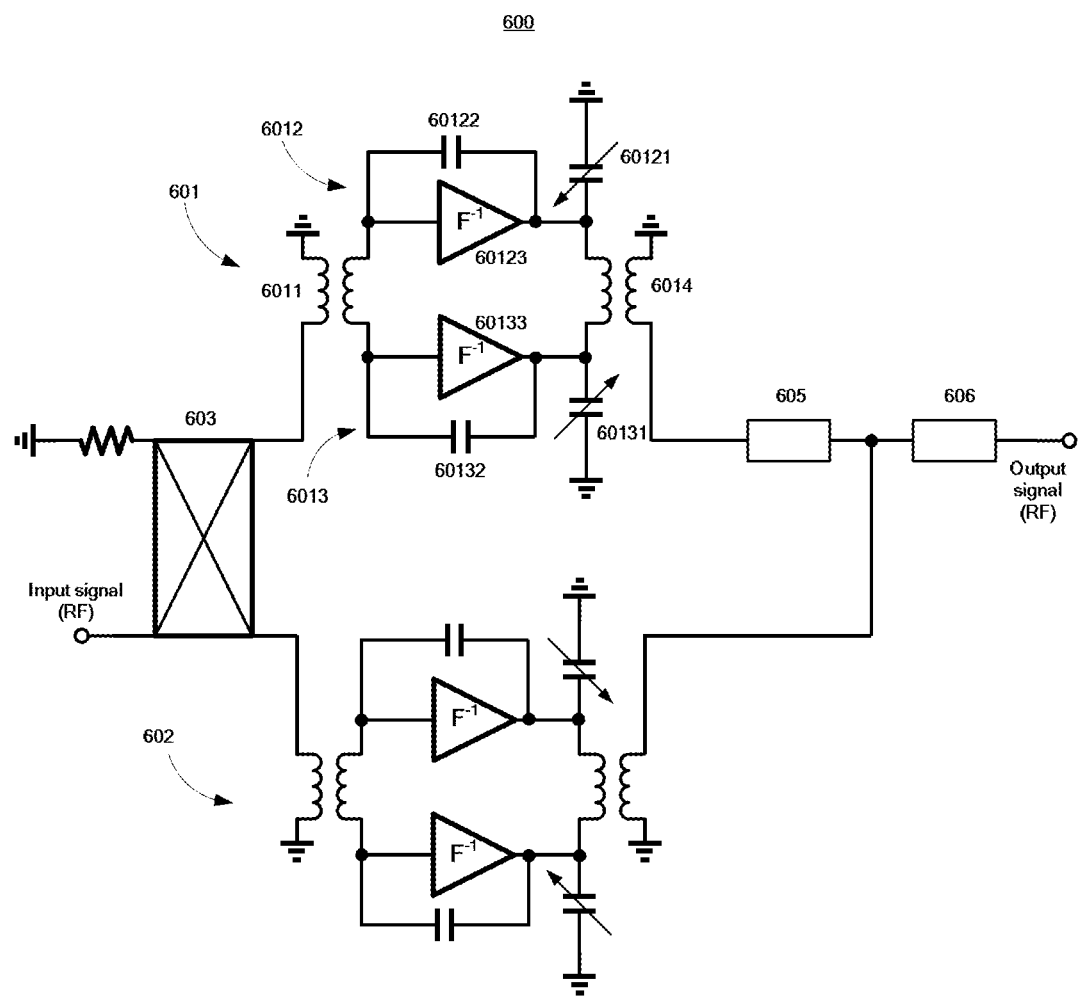
FIG. 6 is a diagram showing the apparatus 100 combing with Doherty power amplifier to form the power amplifier equipment in accordance with an embodiment of the present disclosure.

FIG. 6 is a diagram showing the apparatus 100 combing with Doherty power amplifier to form a power amplifier equipment. As shown in FIG. 6, the power amplifier equipment 600 includes a carrier PA branch 601 and a peak PA branch 602.

The carrier PA branch 601 includes a signal splitter 6011, a sub-branch 6012, a sub-branch 6013 and a harmonic eliminator 6014.

In one embodiment, the signal splitter 6011 is configured to split an input signal into two sub-branches 6012 and 6013 in out phase for power amplification, respectively. The signal splitter 6011 could be configured to be a single to differential end network. For example, the signal splitter 6011 could be a Balun device.

The sub-branch 6012(6013) may include at least a harmonic generator 60121(60131), a harmonic feedback device 60122(60132) and a power amplifier 60123(60133).

The power amplifier 60123(60133) could work in a class-$F^{-1}$ mode to open the even order harmonic and to short the odd order harmonic by using an output matching network. The description for the harmonic generator 60121 (60131) and the harmonic feedback device 60121(60131) are the same as description for the harmonic generator 101 and the harmonic feedback device 102, respectively. For example, the harmonic generator 60121(60131) and the harmonic feedback device 60121(60131) could be implemented by Cds and Cgd, respectively.

The harmonic eliminator 6014 could be configured to be a differential to single end network, which is used to combine the outputs of the sub-branches 6012 and 6013 so that the even order harmonic and the intermodulation are cancelled out. For example, the harmonic eliminator 6014 could be a Balun device.

In one embodiment, the sub-branch 6012(6013) may further include an input matching network. The input matching network is configured to open the even order harmonic and to short the odd order harmonic at the input terminal of the power amplifier 60123(60133).

The carrier PA branch 601 includes two Balun devices and two power amplifiers 60123 and 60133 connected to the Balun devices for both input and output. The two power amplifiers 60123 and 60133 operate in reverse phase to each other, and receive a fundamental signal and the injected harmonic. Each power amplifier 60123(60133) is equipped with the harmonic terminated input matching network and Cgd harmonic injection components from the output, which inputs the harmonic injected signal including even order harmonic fed back with the fundamental signal to each of the two power amplifiers 60123 and 60133 from the input terminal. The injected even order harmonic are generated from the output feedback by large linear Cgd and highly nonlinear Cds capacitance.

As shown in FIG. 6, the peak PA branch 602. The peak PA branch 602 could be configured in the same way as carrier PA branch 601.

As shown in FIG. 6, the power amplifier equipment 600 could further include an input splitter 603, which is configured to divide a RF input signal equally into a pair of symmetric sub-branches. The power amplifier equipment 600 could further include an impedance inverter 605 and real-to-real impedance transformer 606.

In one embodiment, two CREE CGH40180PP GaN HEMT devices including four transistors in total could be used for demonstration of the power amplifier equipment 600. The power amplifier equipment 600 could be verified by continuous wave (CW) input signal.

Figure 7:
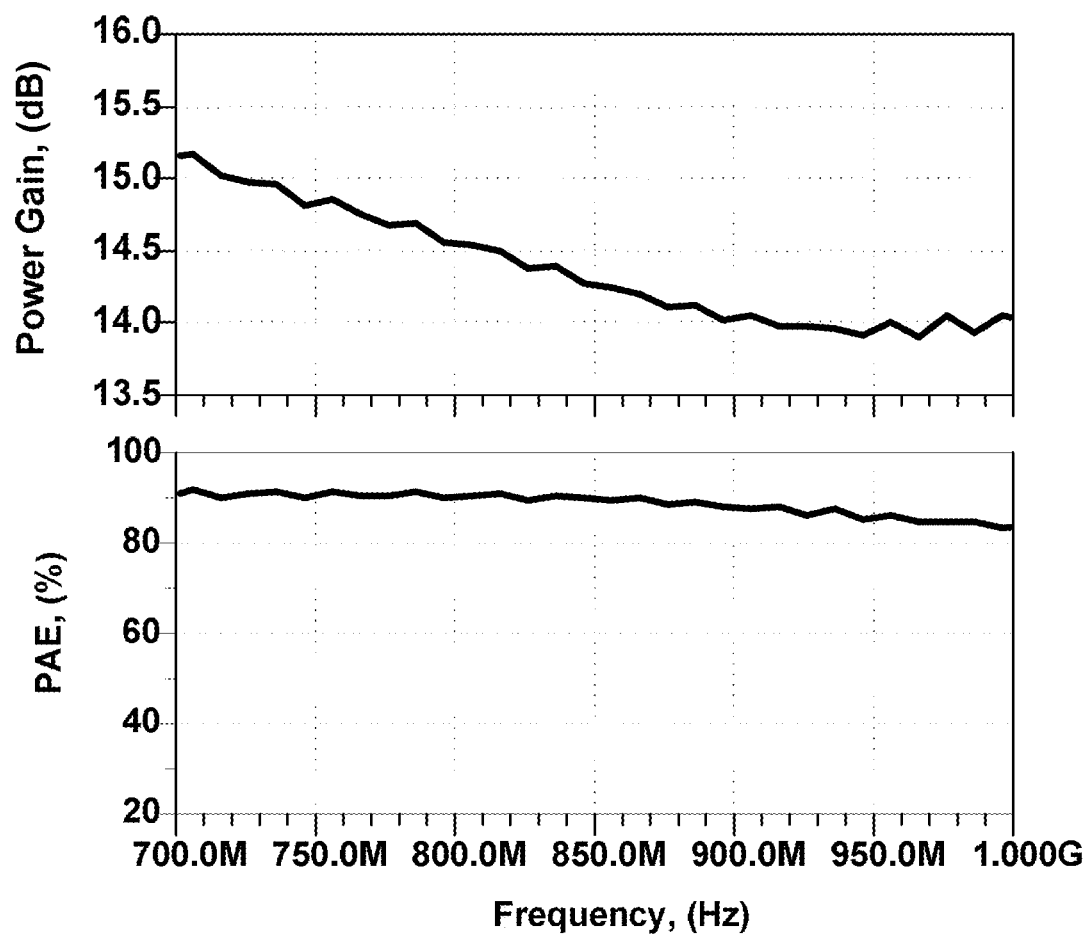
FIG. 7 is a diagram of simulated power gain and PAE versus frequency of the power amplifier equipment 600 in accordance with an embodiment of the present disclosure.

FIG. 7 shows the simulated power gain and PAE (power added efficiency) versus frequency of the power amplifier equipment 600. Due to the lower impedance transformation ratio by using 25 Ohm impedance for matching, the broadband could be achieved as shown in FIG. 7.

As shown in FIG. 7, high efficiency is due to harmonic generation and injection. Broadband is partially attributed to the 25 Ohm matching for amplifier with reduced impedance transformation ratio.

Figure 8:
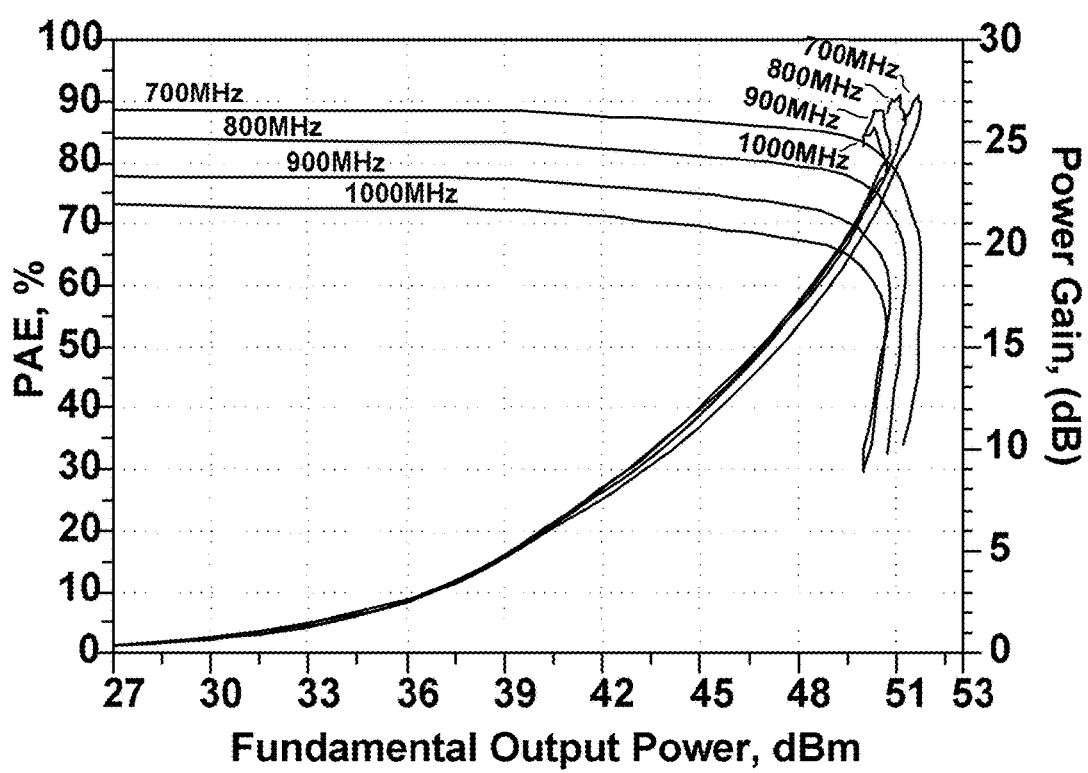
FIG. 8 is a diagram illustrating the power gain and PAE versus fundamental output power of one branch in accordance with an embodiment of the present disclosure.

FIG. 8 illustrates the power gain and PAE versus fundamental output power of one branch. As shown in FIG. 8, over 90% peak power efficiency could be obtained. Therefore, the harmonic injection for high efficiency is verified.

Figure 9:
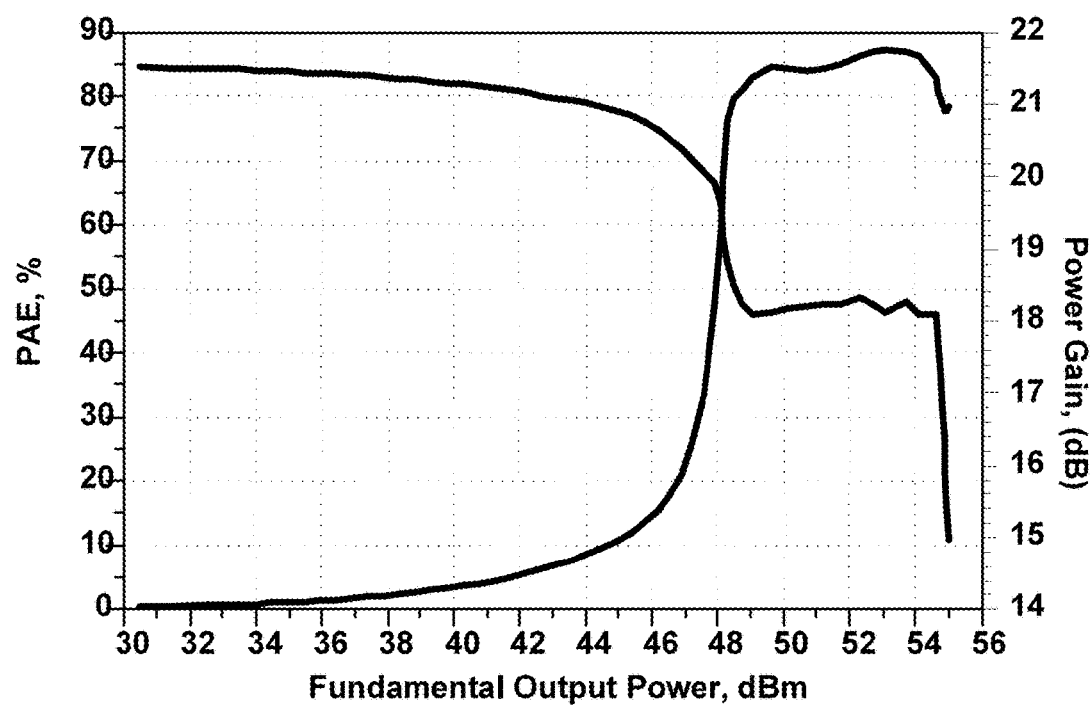
FIG. 9 is a diagram of the power gain and PAE versus fundamental output power of the power amplifier equipment 600.

FIG. 9 illustrates the power gain and PAE versus fundamental output power of the power amplifier equipment 600. As shown in FIG. 9, over 80% high efficiency could be maintained over 6 dB output power back off.

Figure 10:
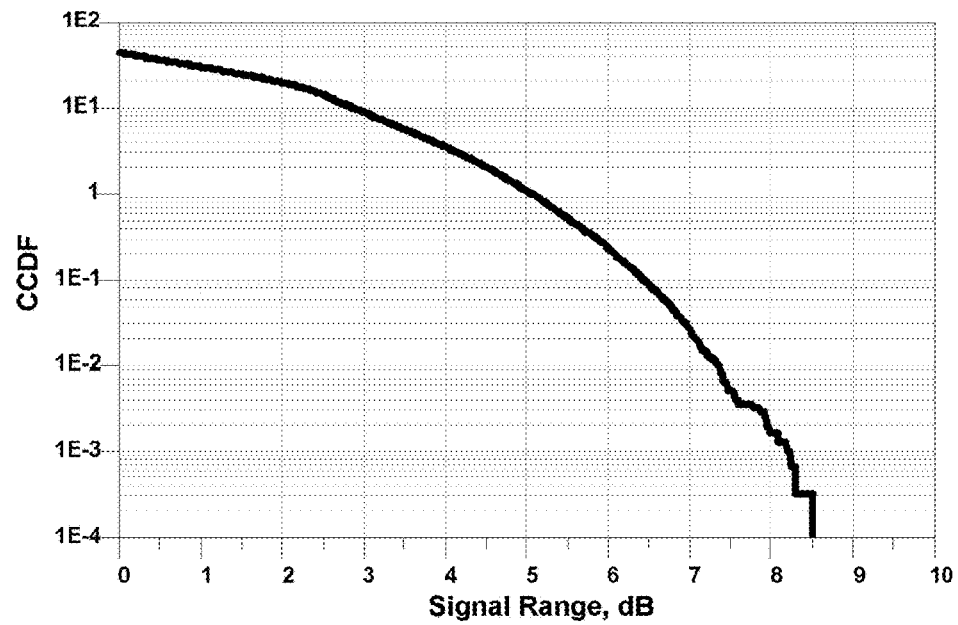
FIG. 10 (a) illustrates a CCDF versus the signal range of the PAPR of input signal for verification in accordance with an embodiment of the present disclosure.
Figure 10:
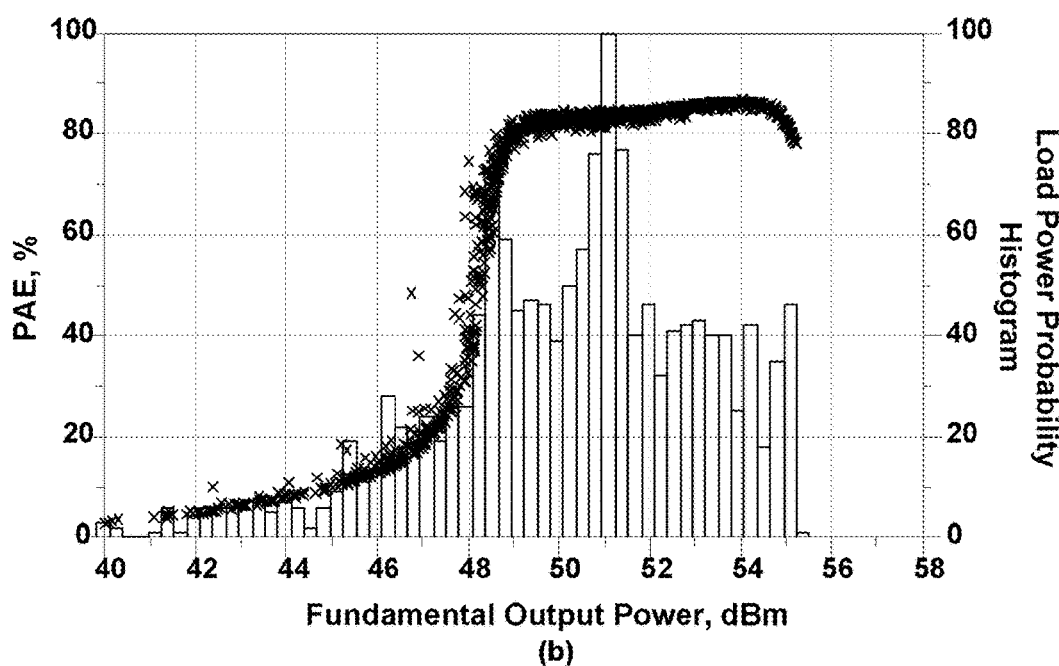

To dive deep into the performance evaluation with modulated signal, especially high PAPR signal, an LTE 64QAM 5 MHz signal with PAPR=8.5 dB is used for simulation. The results are showed in FIG. 10. FIG. 10 (a) illustrates a CCDF (Complementary Cumulative Distribution Function) versus a signal range of the PAPR of input signal for verification. FIG. 10 (b) illustrates PAE and LPP (Load Power Probability) versus the fundamental output power. As shown in FIG. 10 (a) and FIG. 10 (b), little memory effects were observed compared to prior art, which showed excellent linearity and potential linearizability for DPD (Digital Pre-Distortion).

According to FIG. 10 (b), the average PAE with the modulated signal is 62% at 51 dBm average output power.

Figure 11:
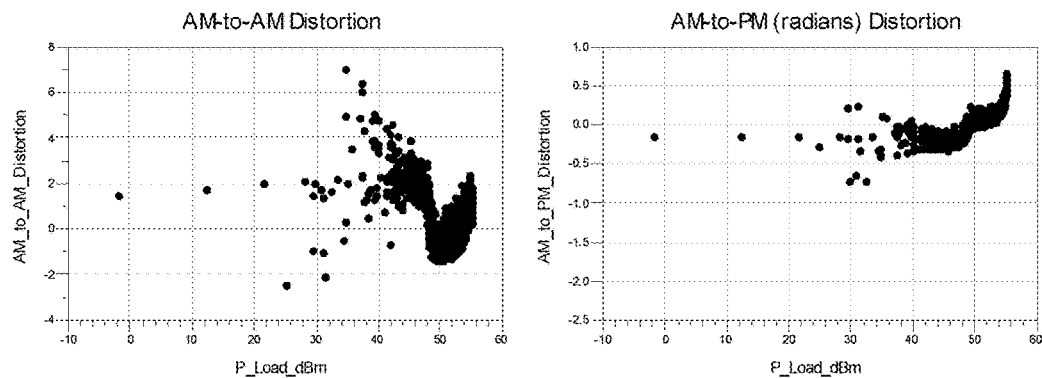
FIG. 11 is a diagram of the AM-AM and AM-PM results with the modulated signal with PAPR=8.5 dB for the power amplifier equipment 600.

FIG. 11 shows the amplitude-to-amplitude conversion (AM-AM) and amplitude-to-phase conversion (AM-PM) results with LTE 64QAM 5 MHz clipped signal with PAPR=8.5 dB. FIG. 11 indicates little memory effects at high power of the power amplifier equipment 600.

Figure 12:
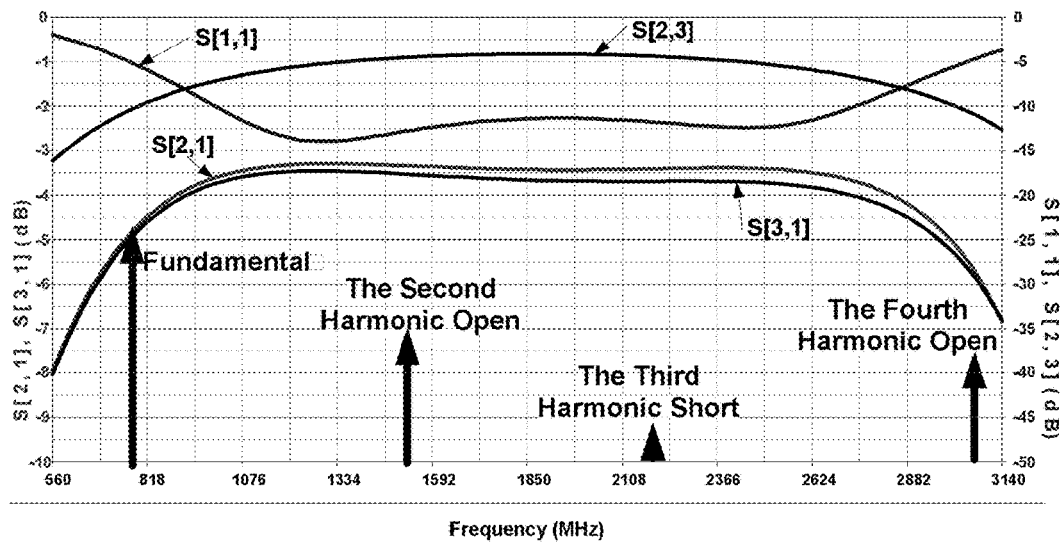
FIG. 12 is a diagram of the broadband Balun of the exemplary design to cover the second and fourth harmonic components for harmonic generation in accordance with an embodiment of the present disclosure.

FIG. 12 illustrates the broadband Balun device of the exemplary design to cover the second and fourth harmonic components for harmonic generation, injection and elimination for high efficiency and linearity.

In one embodiment, the push pull structure of Balun device cancels even order harmonics, as even order harmonics are in phase. The same is true for other even order products falling within the operating bandwidth of the Balun device, as shown in FIG. 12. SO, for present embodiment, at least one even order harmonic component/second harmonic should fall into the operation bandwidth of the Balun device.

As can be seen from the above embodiments, the harmonic could be feedback to the power amplifier, so as to improve the efficiency of the power amplifier. In addition, the harmonic in the output signal is eliminated, so as to improve the linearity of the power amplifier. Therefore, the efficiency of the power amplifier can be improved without degrading the linearity. The harmonic generation and feedback could be implemented by the inherent of Cgd and Cds of the amplifier transistor. Therefore, no active components and external devices are needed.

Second Aspect of Embodiments

A method for improving efficiency of power amplifier is provided in an embodiment. The method is corresponding to the apparatus in the first aspect of embodiments. The method is implemented at a network device as an example.

Flowchart of a method 1300 for improving efficiency of power amplifier in accordance with an embodiment of the present disclosure, and illustrates the method by taking a network device as an example. However, it is not limited thereto, for example the method of this disclosure may be implemented at a terminal device.

Figure 13:
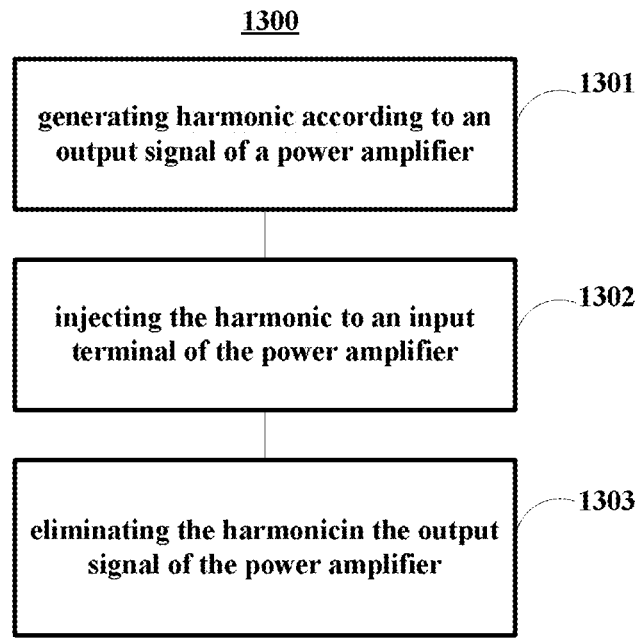
FIG. 13 is a flowchart of a method 1300 for improving efficiency of power amplifier in accordance with an embodiment of the present disclosure.

As shown in FIG. 13, the method 1300 includes:

Block 1301: generating harmonic according to an output signal of a power amplifier;

Block 1302: injecting the harmonic to an input terminal of the power amplifier; and Block 1303: eliminating the harmonic in the output signal of the power amplifier.

In one embodiment, the generated harmonic is even order harmonic, the injected harmonic is even order harmonic, and the eliminated harmonic is even order harmonic.

In one embodiment, an intermodulation in the output signal of the power amplifier could be eliminated, where the intermodulation is caused by the harmonic mixing up.

In one embodiment, the Block 1301 could include:

Block 13011: generating odd order harmonic and even order harmonic according to the output signal of the power amplifier;

Block 13012: opening the even order harmonic and shorting the odd order harmonic at the output terminal of the power amplifier; and Block 13013: opening the even order harmonic and shorting the odd order harmonic at the input terminal of the power amplifier is omitted.

In one embodiment, at least one nonlinear variable capacitor could be used for generating odd order harmonic and even order harmonic. Linear capacitor with a proper value could be used for injecting the generated harmonic into the power amplifier.

The description for each block of the method could be referred to the first aspect of the embodiments. Therefore, the description for each block of the method would be omitted in the second aspect of the embodiments.

As can be seen from the above embodiments, the efficiency of the power amplifier could be improved and the linearity of the power amplifier is improved.

Third Aspect of Embodiments

An apparatus for improving efficiency of a Doherty power amplifier is provided in one embodiment.

Figure 14:
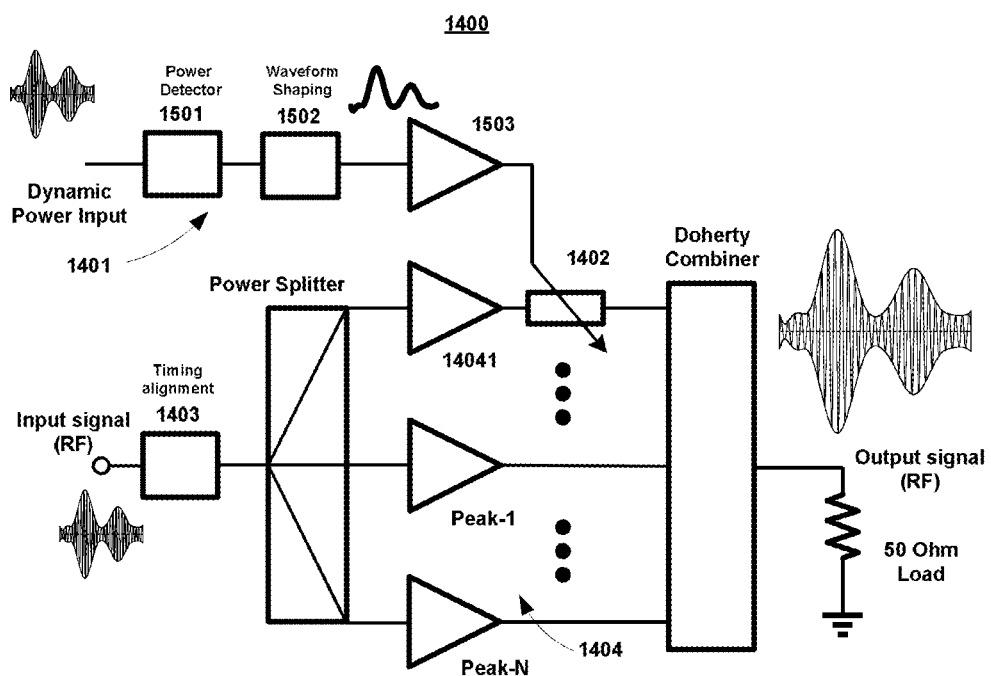
FIG. 14 is a generalized diagram of an apparatus for improving efficiency of a Doherty power amplifier in accordance with an embodiment of the present disclosure.

FIG. 14 shows a diagram of an apparatus for improving efficiency of a Doherty power amplifier. As shown in FIG. 14, an apparatus 1400 includes an impedance tuner controller 1401, an impedance tuner 1402 and a timing alignment device 1403.

In one embodiment, the impedance tuner controller 1401 is configured to generate a controlling signal according to power envelope of an input signal of a Doherty power amplifier 1404. The impedance tuner 1402 is configured to connect to output terminal of a carrier amplifier 14041 of the Doherty power amplifier 1404, and an impedance of the impedance tuner 1402 could be tuned according to the controlling signal. The timing alignment device 1403 is configured to compensate delay between the input signal and the controlling signal.

According to the embodiment, the present disclosure could dynamically changes the saturation power of the carrier amplifier instantaneously so that much higher low power efficiency could be achieved.

As shown in FIG. 14, the impedance tuner controller 1401 could include a power detector 1501, a waveform shaping device 1502 and a tuner driver amplifier 1503.

In one embodiment, the power detector 1501 is configured to detect a level of the power. The waveform shaping device 1502 is configured to generate a waveform of the controlling signal according to the level of the power. The tuner driver amplifier 1503 is configured to amplify the waveform and output the amplified controlling signal to the impedance tuner 1402.

In one embodiment, the power of the input signal could be implemented either in digital base band digital signal processing (DSP) block or a RF coupling scheme to obtain the dynamic power input. The dynamic power is instantaneous power level in order of envelope cycles.

In one embodiment, the power detector 1501 is used to detect the dynamic input power level synchronized with RF input power either in digital base band or RF power domain.

After the power detection, the waveform shaping device 1502 is used to modify the control waveform to adapt the impedance tuner 1402 to track the optimal load impedance of carrier amplifier 14041 based on load pull measurements.

The small control signal is amplified by the tuner driver amplifier 1503 so that sufficient voltage and current could be obtained to drive the tuning element in the impedance tuner 1402.

In one embodiment, a bandwidth of the tuner driver amplifier 1503 is at least 3 times of that of the power envelope of the input signal.

The output of the tuner driver amplifier 1503 is injected into the impedance tuner 1402, which contains at least one tuning element, could change the reactance and resistance of the tuner to track the optimal impedance on Smith chart to maintain high efficiency with varying input power envelopes.

In one embodiment, the impedance tuner could include at least one varactor stack. For example, the tuning element used is distortion free varactor stack (DFVS) combination, which exhibit highly linear character although the varactor diode themselves are non-linear.

In one embodiment, the varactor stack comprises varactor with intermodulation distortions cancelled out in a pair configuration. The varactor stacks could be further nested to provide improved tuning range and power handling capability.

Figure 15:
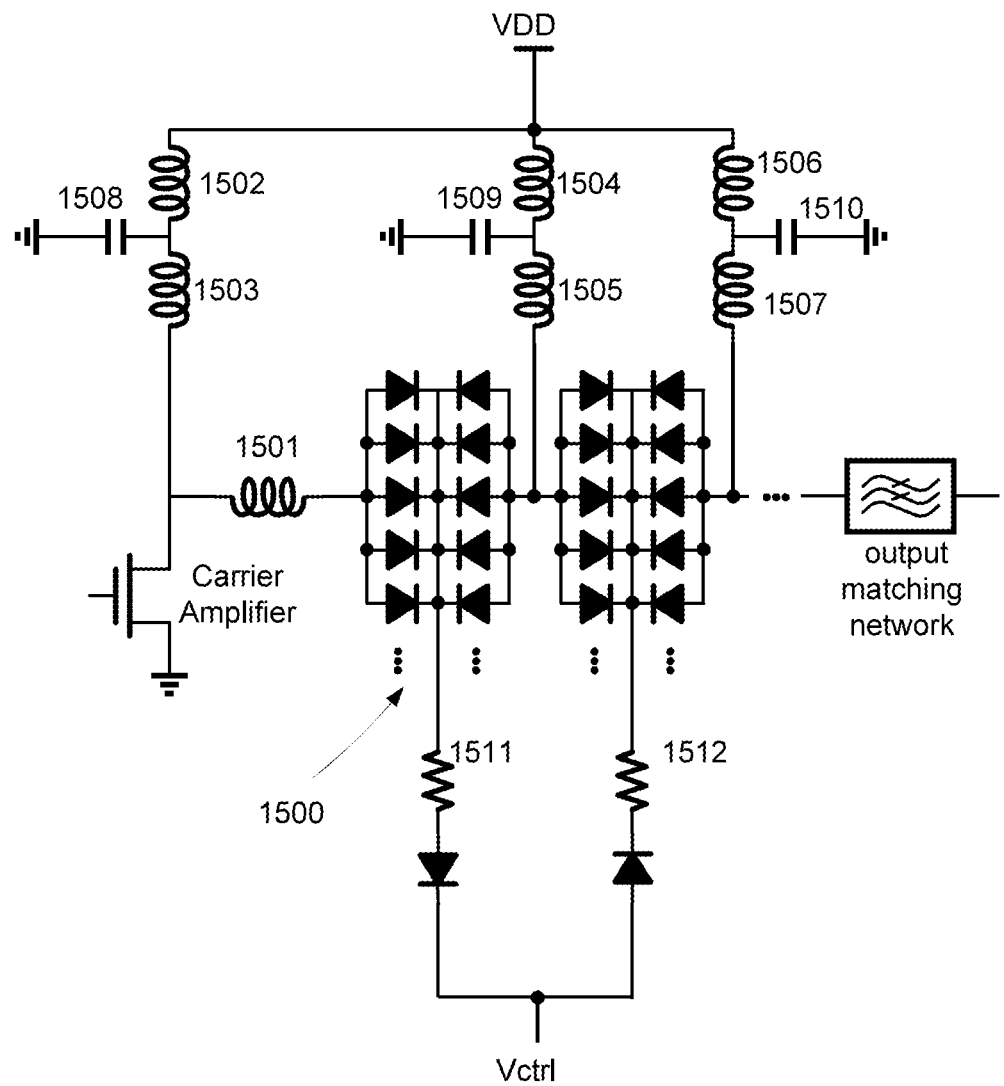
FIG. 15 is a diagram of tuning element circuits in accordance with an embodiment of the present disclosure.

Tuning element circuits are shown in FIG. 15. N diodes in DFVS combination 1500 will generate 1/N voltage per diode so that it results in the maximum power as $N^2$ times folding. The reduced voltage swing per diode directly benefits linearity. As shown in FIG. 15, $V_{ctrl}$ denotes the controlling signal output from the tuner driver amplifier 1503. As shown in FIG. 15, the DFVS combination 1500 could also connect to inductors 1501-1507, capacitors 1508-1510, resistors 1511-1512 and $V_{DD}$.

Figure 16:
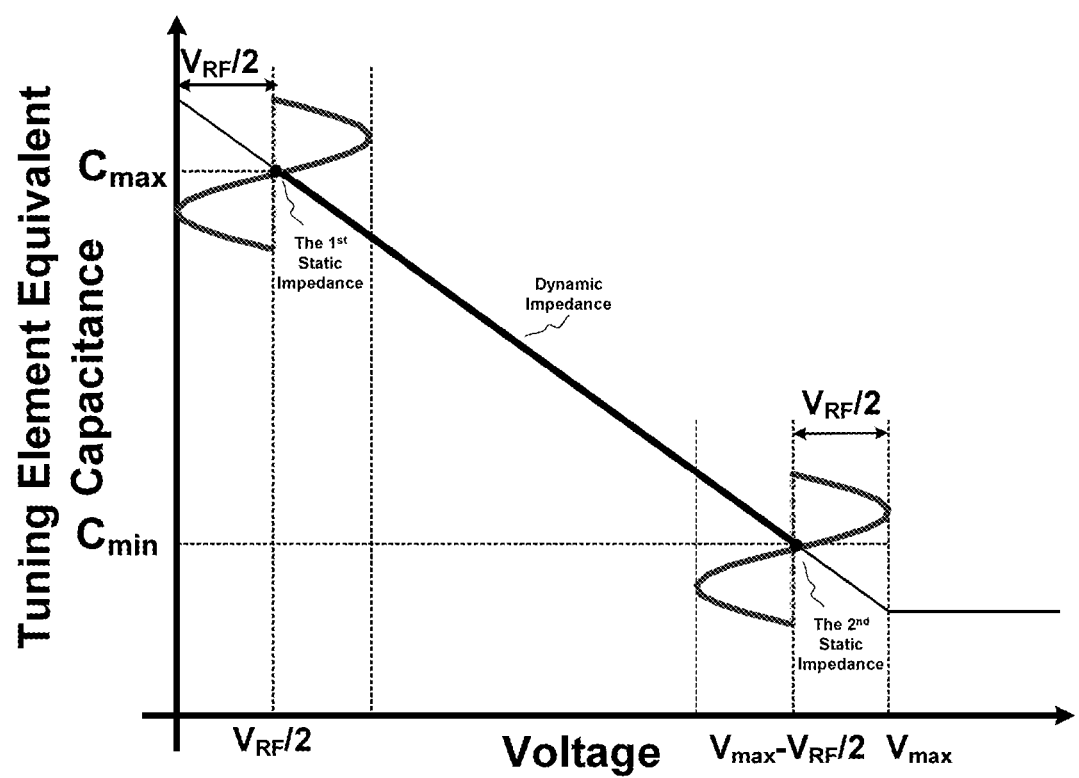
FIG. 16 is a diagram showing the turning range of the capacitance of the impedance tuner in accordance with an embodiment of the present disclosure.

FIG. 16 illustrates the turning range of the capacitance of the impedance tuner 1402. The tuning range $C_{ratio}$ of the capacitance of the impedance tuner 1402 can be expressed as $C_{ratio} = C_{max}/C_{min}$, where $C_{max}$ and $C_{min}$ are the maximum and minimum available capacitances.

As shown in FIG. 16, when the output voltage of the carrier amplifier is smaller than $V_{RF}/2$, the impedance of the impedance tuner 1042 could be fixed at a $1^{st}$ static value. When the output voltage of the carrier amplifier reaches $V_{RF}/2$, the impedance of the impedance tuner 1042 could be dynamic impedance. When the output voltage of the carrier amplifier is larger than Vmax−$V_{RF}/2$, the impedance of the impedance tuner 1042 could be fixed at a $2^{nd}$ static value.

As shown in FIG. 16, the wider capacitance variation range working with a range of voltages, the higher tuning range will be presented.

In one embodiment, the timing alignment device 1403 is used to compensate the delay the controlling signal and the input signal. These two signals should be highly synchronized to guarantee the performance of dynamic impedance tuning for the carrier amplifier.

The timing alignment device 1403 could be either implemented in digital base band or RF delay lines. The Doherty amplifier 1404 is used to receive the outputs from the timing alignment device 1403.

In one embodiment, the impedance tuner 1402 is arranged in series with the carrier amplifier of the Doherty PA. There are three possible placements to arrange an output matching network of the carrier amplifier 14041 and the impedance tuner 1402.

Figure 17:
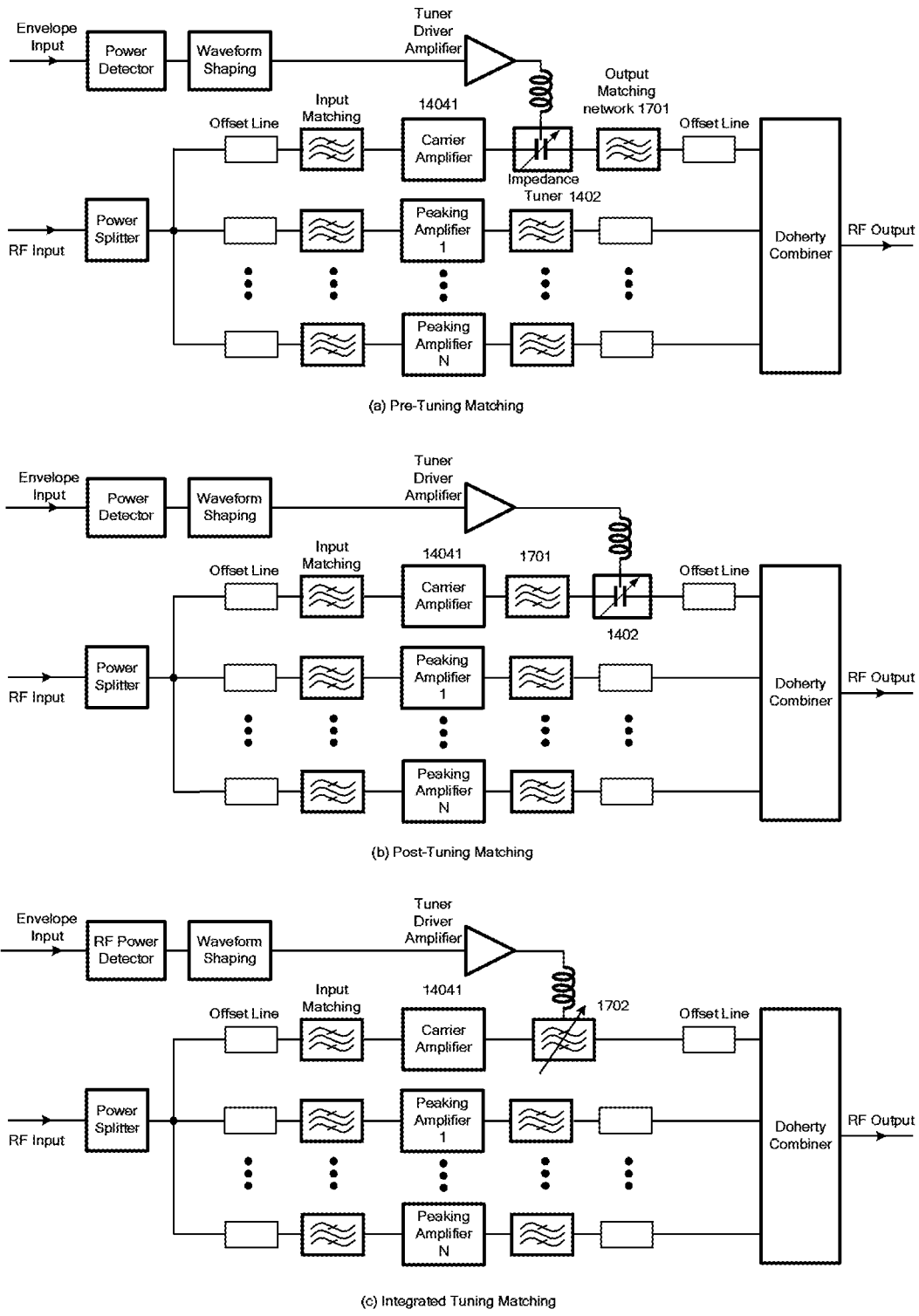
FIG. 17 is a diagram showing 3 types of placement of the output matching network and the impedance tuner using blocks in accordance with an embodiment of the present disclosure.

FIG. 17 shows 3 types of placement of the output matching network and the impedance tuner using blocks.

FIG. 17 (A) shows a pre-tuning type, where a placement order is the carrier amplifier 14041, the impedance tuner 1402 and the output matching network 1701.

FIG. 17 (B) shows a post-tuning type, where the order is the carrier amplifier 14041, the output matching network 1701 and the impedance tuner 1402.

FIG. 17 (C) shows an integrated tuning type, where the impedance tuner 1402 is incorporated into the elements of the output matching network 1701 to form a network 1702.

Figure 18:
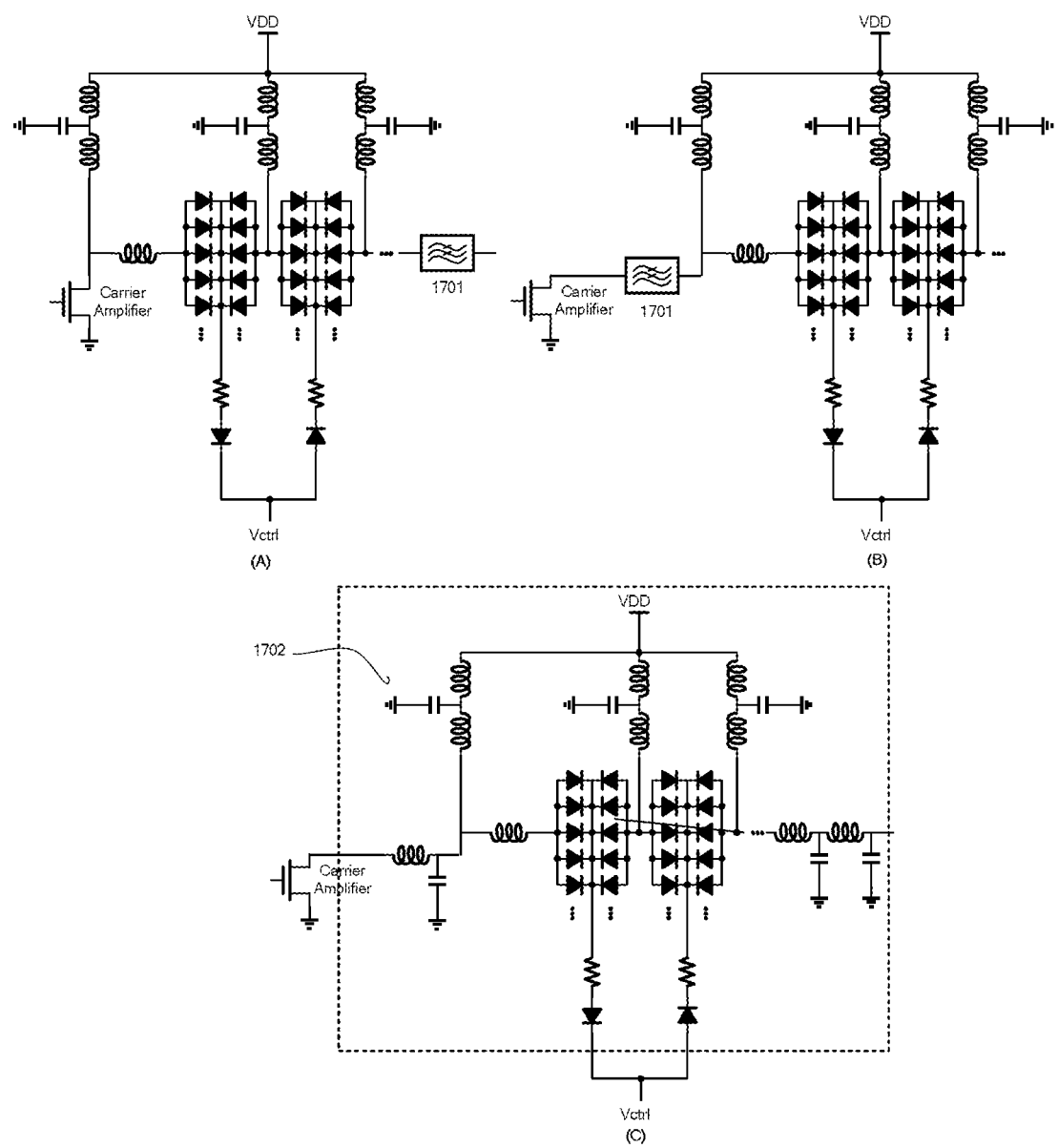
FIG. 18 is a diagram showing 3 types of placement of the output matching network and the impedance tuner using circuit element.

FIG. 18 shows 3 types of placement of the output matching network and the impedance tuner using circuit element. FIGS. 18 (A), (B) and (C) shows the pre-tuning type, the post-tuning type and the integrated tuning type, respectively.

The present disclosure is not limited to any specific Doherty topology. It is a systematic method to further increase efficiency based on existing Doherty PA performance. The feasible Doherty PA types are: normal Doherty, inverted Doherty, symmetric Doherty, asymmetric Doherty, uneven Doherty, parallel Doherty, serial Doherty, multi-way Doherty, multistage Doherty and Digital Doherty. This disclosure utilizes dynamic load tracking to further enhance Doherty PA efficiency.

Figure 19:
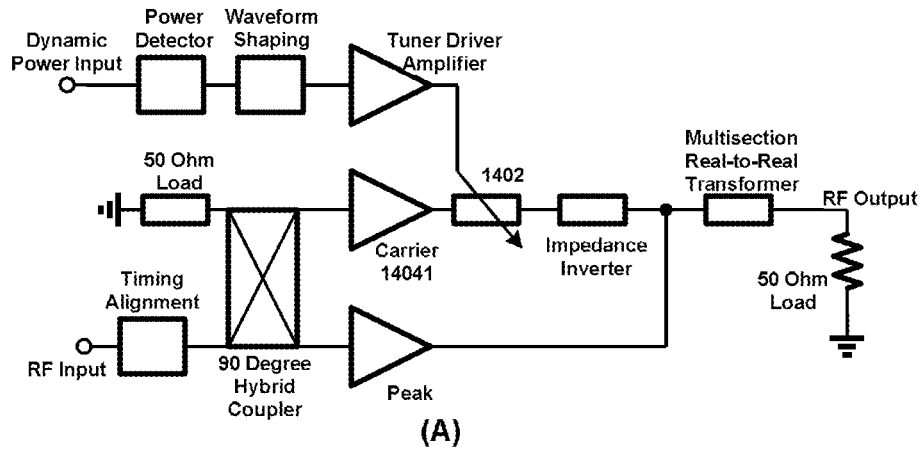
FIG. 19 is a diagram showing three main variants of present disclosure for dynamic load modulation.
Figure 19:
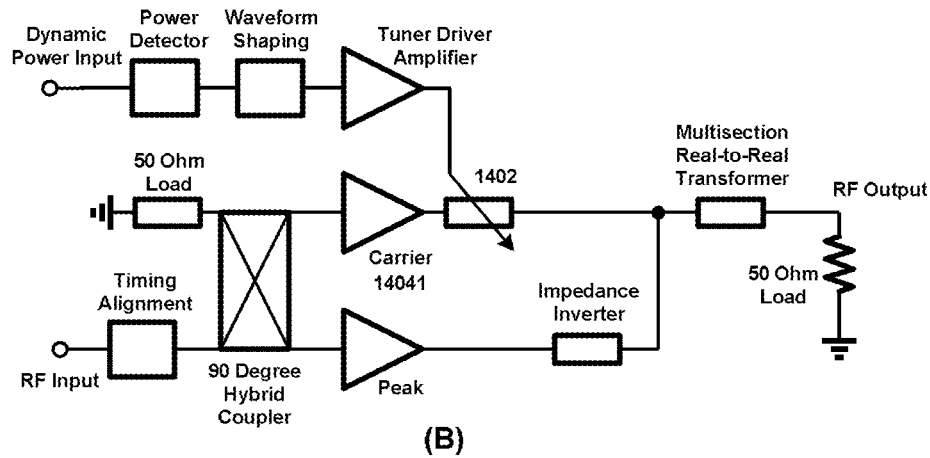
Figure 19:
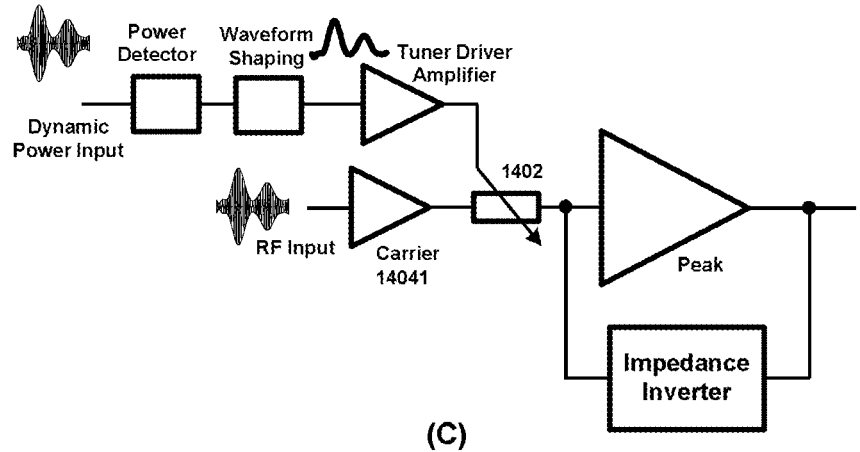

FIG. 19 demonstrates several types of two-way Doherty PAs used in present disclosure. FIG. 19 (A) demonstrates an embodiment of present disclosure for a normal Doherty PA, FIG. 19 (B) demonstrates an embodiment of present disclosure for an inverted Doherty PA, and FIG. 19 (C) demonstrates an embodiment of present disclosure for a serial type Doherty PA.

In one embodiment, the working principle of present disclosure for two way Doherty PA could be:

(1) when power level of input signal is lower than a first value so that power level of an output of the power amplifier is lower than a 1st threshold, the impedance of the impedance tuner is fixed at a first static value;

(2) when power level of input signal is lower than a second value so that power level of the output of the power amplifier is higher than the 1st threshold and lower than a second threshold, the impedance of the impedance tuner is dynamically adjusted by the controlling signal according to optimum load impedance trajectory based on load pull measurements;

(3) when power level of input signal is higher than the second value so that power level of the output of the power amplifier enters Doherty operation (corresponding to Doherty Region shown in FIG. 20), the impedance of the impedance tuner is fixed at a second static value. When the power level of input signal reaches a value so that the power level of the output of the power amplifier reaches a third threshold, the Doherty operation finishes and reach the maximum output power.

Figure 20:
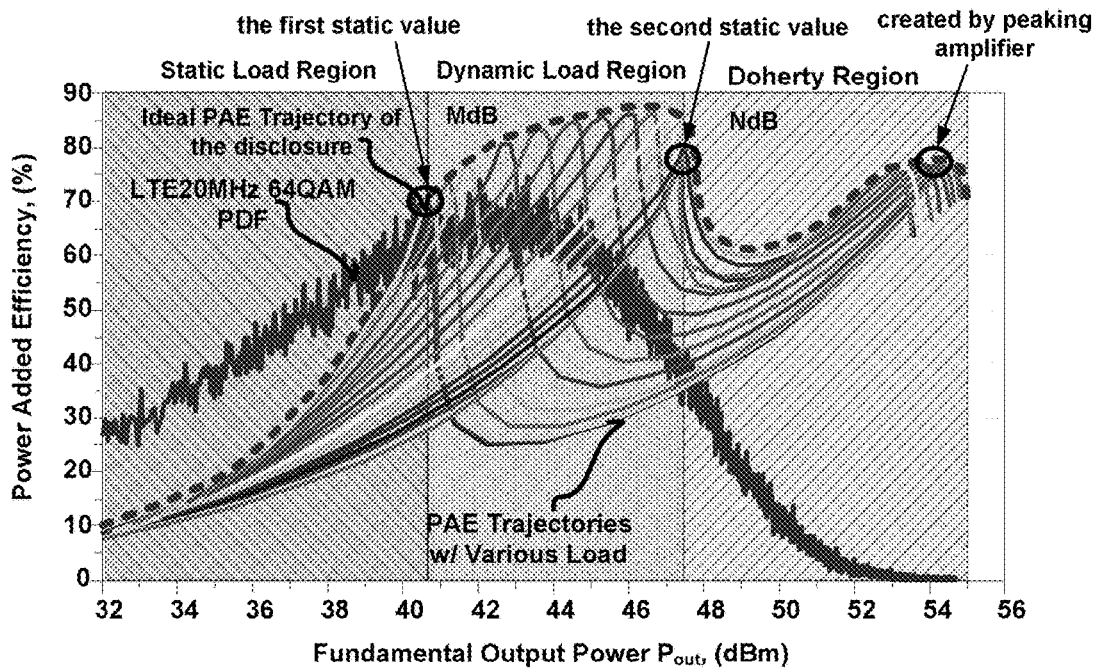
FIG. 20 is a diagram showing the efficiency trajectory of present disclosure with a two-way Doherty PA embodiment.

FIG. 20 illustrates the efficiency trajectory of present disclosure with two-way Doherty. FIG. 20 also illustrates the extended output power back off range with high efficiency with better fitting for LTE signal probability density distribution (PDF) plotted.

As shown in FIG. 20, passive load modulation (i.e. dynamic value of the impedance of the impedance tuner) provide additional M dB output power back off for high efficiency, while active load modulation (i.e. provided by the peaking amplifiers) provide N dB output power back off for high efficiency. $P_{max}$ is the maximum output power of the Doherty PA in dBm unit.

The working principle of the present disclosure for two way Doherty PA could be seen from FIG. 20 as follows:

(1) at very low input power levels, the impedance tuner is fixed at a first static value to provide a static carrier amplifier efficiency trajectory, in which the output power or saturation current is greatly limited to $P_{max}-(M+N)$ dBm (i.e. the 1st threshold). With reduced saturation power the carrier amplifier could provide a much higher efficiency trajectory than traditional Doherty PA. All peaking amplifiers are turned off.

(2) with input power increasing, when the input power level enters (M+N) dB output power back off range, the passive load modulation starts working. In this region (corresponding to dynamic load region shown in FIG. 20), the efficiency trajectory is no longer static but dynamic change according to the optimal efficiency load impedance trajectory in load pull measurements. All peaking amplifiers are kept off.

(3) with further input power increasing, the input power becomes higher than N dB output power back off range (i.e. the 2nd threshold), then, the impedance tuner 1402 is set at the second static fixed value, where $P_{max}-N$ dBm saturation power is set for the carrier amplifier. No dynamic load modulation would happen in further steps. However, active load modulation would be provided by the peaking amplifiers as a traditional Doherty PA does. When the input power drives the carrier amplifier into saturation, the peaking amplifiers are turned on in pre-determined sequence to provide additional fixed peak efficiency points within N dB output power range to further maintain high efficiency. This active load modulation continuous until the last peaking amplifier saturates, the full output power is delivered then.

In Block (2), at least one impedance tuner modulates the carrier amplifier output impedance in predefined power range, where the tuning element is working in a linear tuning range. Tuning the reactance and resistance of a tuning element requires timing alignment with power level on both control signal and RF signal path. It adjusts the ratio of the reactance and resistance of the tuning element to shift the optimal efficiency load impedance trajectory along varying output power levels.

FIG. 20 illustrates the efficiency trajectory of present disclosure with two-way Doherty. FIG. 20 also illustrates the extended output power back off range with high efficiency with better fitting for LTE signal probability density distribution (PDF) plotted.

Figure 21:
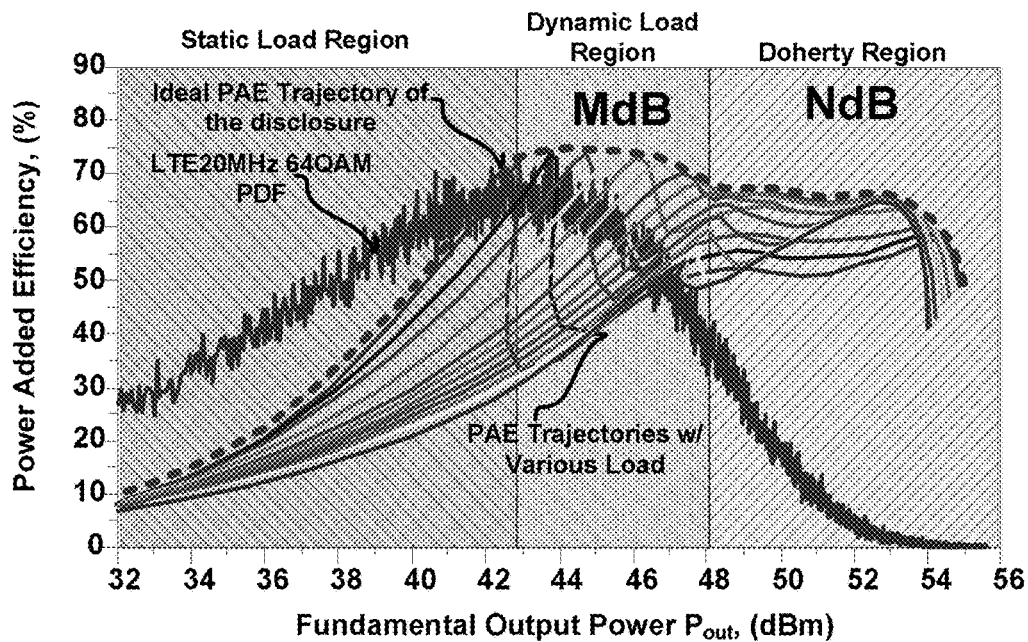
FIG. 21 is a diagram illustrating the principle of present disclosure for a three-stage Doherty PA in accordance with an embodiment of the present disclosure.

FIG. 21 is an illustration of the principle of present disclosure for a three-stage Doherty PA. FIG. 21 also illustrates the extended output power back off range with high efficiency with better fitting for LTE signal probability density distribution (PDF) plotted.

As shown in FIG. 21, the efficiency dropping issue is mitigated by using more stages on Doherty PA.

Therefore, the present disclosure could be used for higher order Doherty PA structure with three, four stages or more. It is also fit for distributed Doherty PA structure as well.

In one embodiment, the present disclosure could also be used for line-up efficiency improvements.

Figures 22, 23:
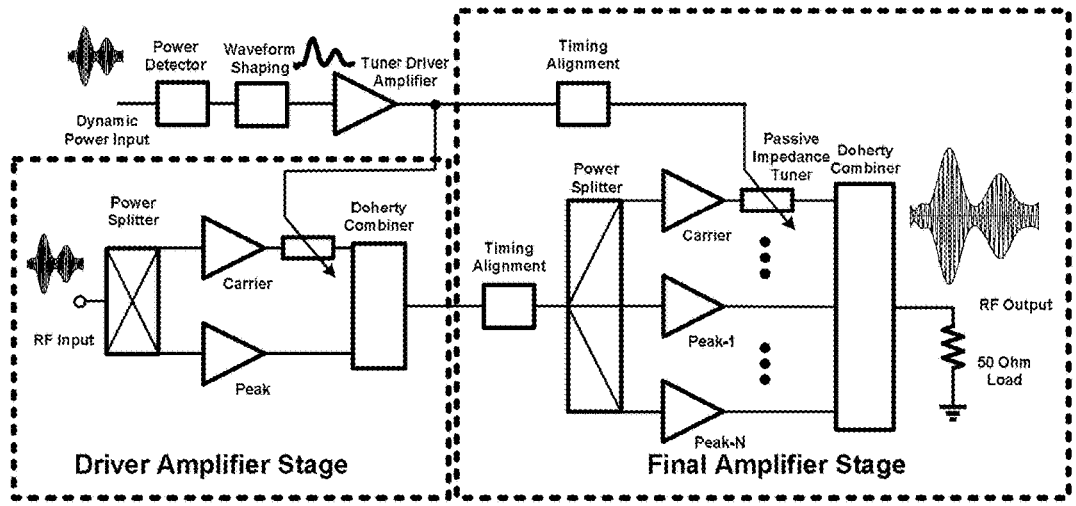
FIG. 22 is a diagram depicting the Doherty line-up diagram of dynamic load configuration for both driver and final stage amplification.
FIG. 23 is a diagram showing flowchart of a method 2300 for improving efficiency of power amplifier in accordance with an embodiment of the present disclosure.

FIG. 22 is an embodiment of present disclosure for line up configuration Doherty PA. As shown in FIG. 22, the same tuner driver amplifier could be applied for both driver amplifier stage and the final amplifier stage of the line-up configuration, so as to improve line up efficiency. This requires proper designs for driver impedance tuner and final impedance tuner to share the same control signal. Also, proper timing alignment should be considered for the synchronization issue. As shown in FIG. 22, the overall transmitter chain efficiency is improved.

As can be seen from the above embodiments, the second aspect of embodiment can greatly assist carrier amplifier for high efficiency at low input power range, which the prior art cannot achieve. The present disclosure dynamically changes the saturation power of the carrier amplifier instantaneously so that much higher low power efficiency could be achieved.

It combines the advantage of both passive load modulation and active load modulation to achieve wider output power back off range for high efficiency. The passive load modulation works as great complementary to expand the range. So, it can easily expand the output power range greater than 10 dB. So for 4G and beyond, the higher PAPR could be mitigated and achieve higher average power added efficiency compared to prior art.

Compact and lower cost, the present disclosure can exhibit higher performance than multistage Doherty but the cost decrease due to the additional modulation process is provided by passive parts, which is definitely less expensive than an active part in RF. For example, the present invention is configured as dynamic load+two stage Doherty. It is performance is higher than 3-stage Doherty PA, so one more expensive RF power transistor could be saved. Also, the area on PCB could be saved for product miniaturization.

It is more flexible than multi-stage Doherty solution because the tuning voltage can determine the range of dynamic load modulation process, it could be trimmed for specific application scenarios.

Compared to multi-stage Doherty, the present invention has additional input port with load modulation control from base band. It provides additional degree of freedom to fine tune the PA performance with precise control.

Fourth Aspect of Embodiments

A method for improving efficiency of power amplifier is provided in an embodiment. The method is corresponding to the apparatus in the third aspect of embodiments. The method is implemented at a network device as an example.

Flowchart of a method 2300 for improving efficiency of power amplifier in accordance with an embodiment of the present disclosure, and illustrates the method by taking a network device as an example. However, it is not limited thereto, for example the method of this disclosure may be implemented in a terminal device.

As shown in FIG. 23, the method 2300 includes:

Block 2301: generating a controlling signal according to power envelope of an input signal of a Doherty power amplifier;

Block 2302: tuning an impedance of an impedance tuner according to the controlling signal; and Block 2303: compensating delay between the input signal and the controlling signal.

In one embodiment, the Block 2301 could include:

Block 23011: detecting a level of the power;

Block 23012: generating a waveform of the controlling signal according to the level of the power;

Block 23013: amplifying the waveform and outputting the amplified controlling signal to the impedance tuner.

In one embodiment, the principle of the method 2300 is as follows:

when power level of input signal is lower than a 1st value so that power level of an output of the power amplifier is lower than a 1st threshold, the impedance of the impedance tuner is fixed at a first static value;

when power level of input signal is lower than a 2nd value so that power level of the output of the power amplifier is higher than the 1st threshold and lower than a 2nd threshold, the impedance of the impedance tuner is adjusted by the controlling signal according to optimum load impedance trajectory based on load pull measurements;

when power level of input signal is higher than the second value so that power level of the output of the power amplifier enters Doherty operation, the impedance of the impedance tuner is fixed at a second static value;

when the power level of input signal reaches a value so that the power level of the output of the power amplifier reaches a third threshold, the Doherty operation finishes and reach the maximum output power.

The description for each block of the method could be referred to the first aspect of the embodiments. Therefore, the description for each block of the method would be omitted in the second aspect of the embodiments.

As can be seen from the above embodiments, the efficiency of the power amplifier could be improved.

Fifth Aspect of Embodiments

In the fifth aspect of embodiments, the apparatus 100 in the first aspect of embodiments and the apparatus 1400 in the third aspect of embodiments would merge to improve the efficiency of a Doherty amplifier.

Figure 24:
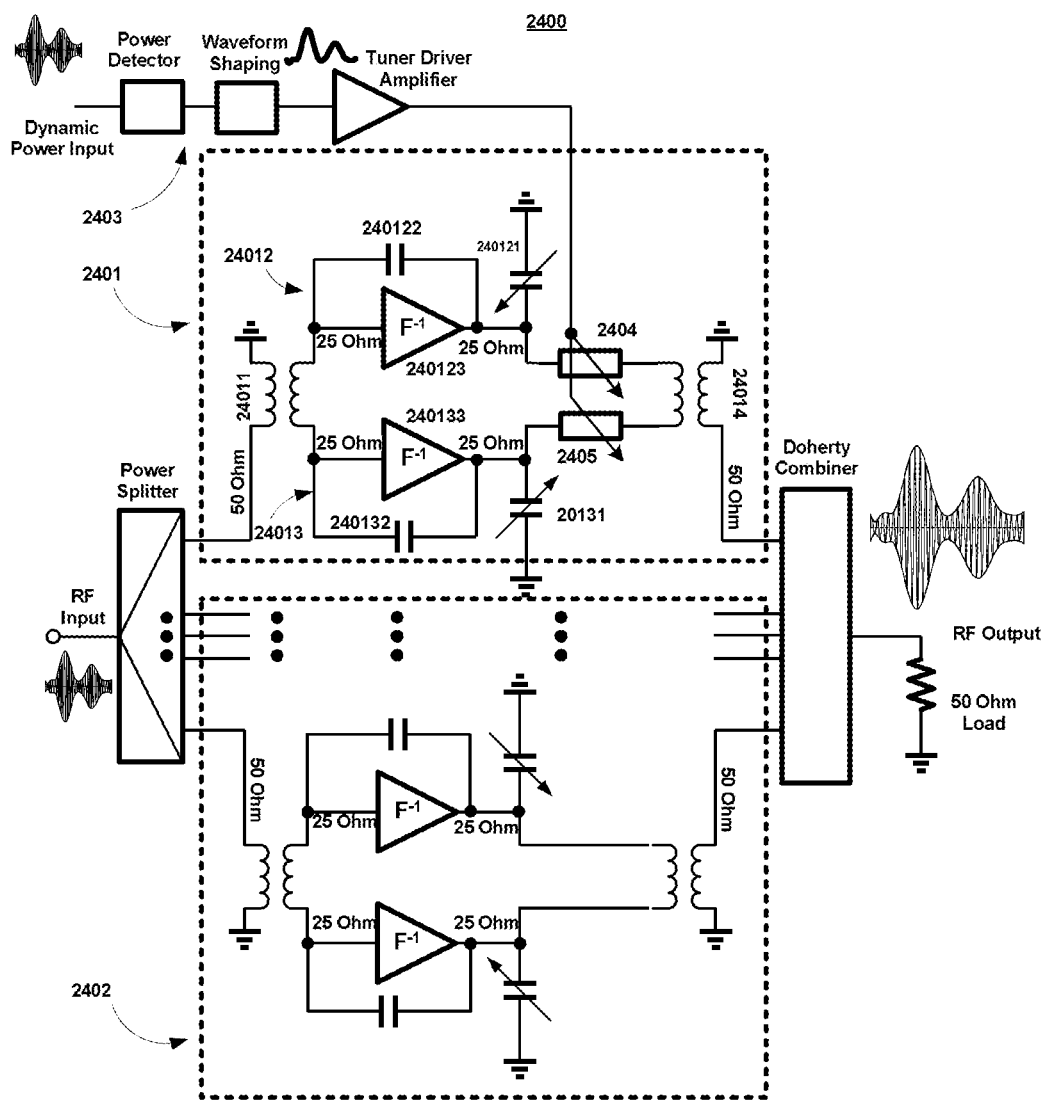
FIG. 24 is a diagram showing the apparatus 100 and apparatus 1400 combing with Doherty power amplifier to form the power amplifier equipment.

FIG. 24 is a diagram showing the apparatus 100 and apparatus 1400 combing with Doherty power amplifier to form the power amplifier equipment.

As shown in FIG. 24, the power amplifier equipment 2400 includes a carrier PA branch 2401, a peak PA branch 2402, an impedance tuner controller 2403, impedance tuners 2404 and 2405 and a timing alignment device (not shown).

The carrier PA branch 2401 includes a signal splitter 24011, a sub-branch 24012, a sub-branch 24013 and a harmonic eliminator 24014.

The sub-branch 24012(24013) may include at least a harmonic generator 240121(240131), a harmonic feedback device 240122(240132) and a power amplifier 240123(240133). The impedance tuner 2404(2405) connect with the output terminal of the power amplifier 240123(240133). The impedance tuner 2404(2405) is controlled by the impedance tuner controller 2403.

The power amplifier 240123 (240133) could work in a class-$F^{-1}$ mode to open the even order harmonic and to short the odd order harmonic by using an output matching network.

In one embodiment, the sub-branch 24012(24013) may further include an input matching network. The input matching network is configured to open the even order harmonic and to short the odd order harmonic at the input terminal of the power amplifier 240123(240133).

As shown in FIG. 24, the impedance tuner 2404(2405) is placed as a post-tuning type.

The description for each unit of the power amplifier equipment 2400 could be referred to the first and third aspects of the embodiments. Therefore, the description for each unit of the power amplifier equipment 2400 of the embodiments is omitted.

Figure 25:
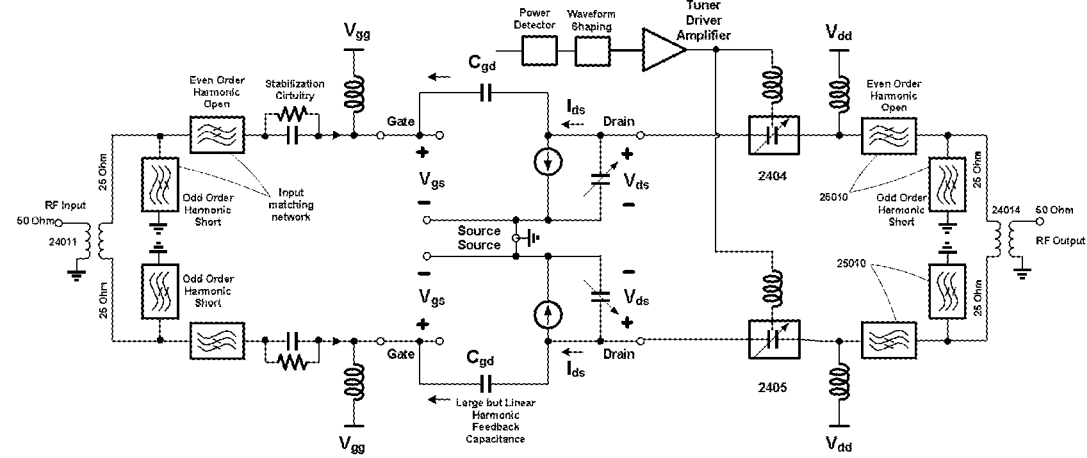
FIG. 25 is a diagram showing the dynamic load carrier PA branch with harmonic injection and elimination using device equivalent circuitry model.

FIG. 25 is a diagram showing the carrier PA branch using device equivalent circuitry model. As shown in FIG. 25, the impedance tuner 2404(2405) is placed as a pre-tuning type, where the impedance tuner 2404(2405) is placed before the output matching network 25010.

As shown in FIG. 25, the output matching network 25010 is also used to open the even order harmonic and to short the odd order harmonic.

As can be seen from the above embodiments, for the combination of the first and the third aspects of the embodiments, the harmonic could be feedback to the power amplifier, so as to improve the efficiency of Doherty PA; the harmonic and intermodulation in the output signal is eliminated, so as to improve the linearity of Doherty PA; and the carrier amplifier could be assist for high efficiency at low input power range.

Sixth Aspect of Embodiments

An apparatus in a wireless communication system is provided in these embodiments.

Figure 26:
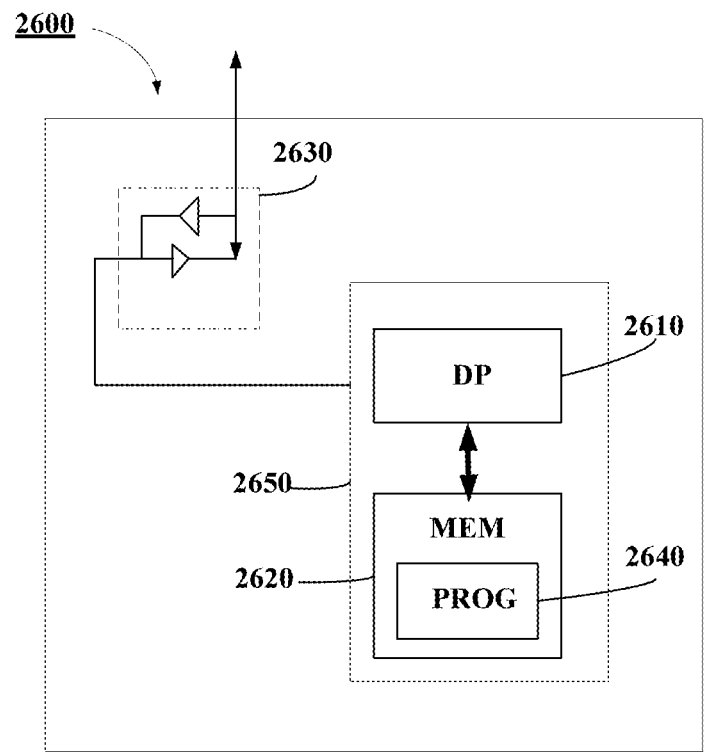
FIG. 26 shows a simplified block diagram of an apparatus 2600 in a wireless communication system in accordance with an embodiment of the present disclosure.

FIG. 26 shows a simplified block diagram of an apparatus 2600 in a wireless communication system in accordance with an embodiment of the present disclosure. It would be appreciated that the apparatus 2600 may be implemented as at least a part of, for example, a network device or a terminal device, especially may be implemented as at least a part of, for example, a transmitter or a transceiver included in a network device or a terminal device.

As shown in FIG. 26, the apparatus 2600 includes: a communicating means 2630 and a processing means 2650. The processing means 2650 includes a data processor (DP) 2610, a memory (MEM) 2620 coupled to the DP 2610. The communicating means 2630 is coupled to the DP 2610 in the processing means 2650. The MEM 2620 stores a program (PROG) 2640. The communicating means 2630 is for communications with other devices, which may be implemented as a transceiver for transmitting/receiving signals.

In some embodiments where the apparatus 2600 acts as a network device, the processing means 2650 may be configured to perform peak cancellation to the target signal and obtain the output signal, and the communicating means 2630 may be configured to transmit the output signal or receive the output signal transmitted by a terminal device. In some other embodiments where the apparatus 2600 acts as a terminal device, the processing means 2650 may be configured to perform peak cancellation to the target signal and obtain the output signal, and the communicating means 2630 may be configured to transmit the output signal or receive the output signal transmitted by the network device.

For example, the memory 2620 stores a plurality of instructions; and the processor 2610 couples to the memory 2620 and could be configured to execute the instructions to: generate one or more harmonic according to an output signal of a power amplifier; inject the harmonic to an input terminal of the power amplifier; and eliminate the harmonic in the output signal of the power amplifier.

For example, the processor 2610 could also be configured to execute the instructions to: generate a controlling signal according to power envelope of an input signal of a Doherty power amplifier; tune an impedance of an impedance tuner connecting to an output terminal of a carrier of the Doherty power amplifier according to the controlling signal; and compensate delay between the input signal and the controlling signal.

The PROG 2640 is assumed to include program instructions that, when executed by the associated DP 2610, enable the apparatus 2600 to operate in accordance with the embodiments of the present disclosure, as discussed herein with the method 400 or 500. The embodiments herein may be implemented by computer software executable by the DP 2610 of the apparatus 2600, or by hardware, or by a combination of software and hardware. A combination of the data processor 2610 and MEM 2620 may form processing means 2650 adapted to implement various embodiments of the present disclosure.

The MEM 2620 may be of any type suitable to the local technical environment and may be implemented using any suitable data storage technology, such as semiconductor based memory devices, magnetic memory devices and systems, optical memory devices and systems, fixed memory and removable memory, as non-limiting examples. While only one MEM is shown in the apparatus 2600, there may be several physically distinct memory modules in the apparatus 2600. The DP 2610 may be of any type suitable to the local technical environment, and may include one or more of general purpose computers, special purpose computers, microprocessors, digital signal processors (DSPs) and processors based on multicore processor architecture, as non-limiting examples. The apparatus 2600 may have multiple processors, such as an application specific integrated circuit chip that is slaved in time to a clock which synchronizes the main processor.

A device (such as a terminal device or a network device, not shown) is provided in an embodiment, the device includes the apparatus 100 or 2600, and the same contents as those in the first aspect and the second aspect of embodiments are omitted.

An embodiment of the present disclosure provides a computer program product being tangibly stored on a computer readable storage medium and including instructions which, when executed by a device or an apparatus, cause the device or the apparatus to perform a method provided in the second aspect of embodiments.

An embodiment of the present disclosure provides a storage medium in which a computer program is stored, wherein the computer program enables a computer to carry out a method provided in the second aspect of embodiments in an apparatus or a transmitter.

It will be appreciated that embodiments of the invention described herein may be comprised of one or more conventional processors and unique stored program instructions that control the one or more processors to implement, in conjunction with certain non-processor circuits, some, most, or all of the functions of generating a multicarrier communication signal having a reduced crest factor as described herein. The non-processor circuits may include, but are not limited to, a radio transmitter, signal drivers, clock circuits, power source circuits, and user input devices. As such, these functions may be interpreted as blocks of a method for generating a signal having a reduced crest factor. Alternatively, some or all functions could be implemented by a state machine that has no stored program instructions, or in one or more application specific integrated circuits (ASICs), in which each function or some combinations of certain of the functions are implemented as custom logic. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and integrated circuits (ICs) with minimal experimentation.

For example, one or more of the examples described herein may be implemented in a field programmable gate array (FPGA), typically includes an array of programmable tiles. These programmable tiles can include, for example, input/output blocks (IOBs), configurable logic blocks (CLBs), dedicated random access memory blocks (BRAMs), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or other computing device. While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

By way of example, embodiments of the present disclosure can be described in the general context of machine-executable instructions, such as those included in program modules, being executed in a device on a target real or virtual processor. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the present disclosure may be written in any combination of one or more programming languages. These program codes may be provided to a processor or controller of a general purpose computer, special purpose computer, or other programmable data processing apparatus, such that the program codes, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

The above program code may be embodied on a machine readable medium, which may be any tangible medium that may contain, or store a program for use by or in connection with an instruction execution system, apparatus, or device. The machine readable medium may be a machine readable signal medium or a machine readable storage medium. The machine readable medium may include but not limited to an electronic, magnetic, optical, electromagnetic, infrared, or semiconductor system, apparatus, or device, or any suitable combination of the foregoing.

More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of this disclosure, the device may be implemented in the general context of computer system-executable instructions, such as program modules, being executed by a computer system. Generally, program modules may include routines, programs, objects, components, logic, data structures, and so on that perform particular tasks or implement particular abstract data types. The device may be practiced in distributed cloud computing environments where tasks are performed by remote processing devices that are linked through a communications network. In a distributed cloud computing environment, program modules may be located in both local and remote computer system storage media including memory storage devices.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in language specific to structural features and/or methodological acts, it is to be understood that the present disclosure defined in the appended claims is not necessarily limited to the specific features or acts described above. Rather, the specific features and acts described above are disclosed as example forms of implementing the claims.

In the context of this disclosure, the device may be implemented in the general context of computer system-executable instructions, such as program modules, being executed by a computer system. Generally, program modules may include routines, programs, objects, components, logic, data structures, and so on that perform particular tasks or implement particular abstract data types. The device may be practiced in distributed cloud computing environments where tasks are performed by remote processing devices that are linked through a communications network. In a distributed cloud computing environment, program modules may be located in both local and remote computer system storage media including memory storage devices.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in language specific to structural features and/or methodological acts, it is to be understood that the present disclosure defined in the appended claims is not necessarily limited to the specific features or acts described above. Rather, the specific features and acts described above are disclosed as example forms of implementing the claims.

What is claimed is:

1. An apparatus, the apparatus comprising:
a harmonic generator, configured to generate even order harmonic according to an output signal of a power amplifier, wherein the harmonic generator comprises:
a harmonic generating device, configured to generate odd order harmonic and the even order harmonic according to the output signal of the power amplifier;
an output match network, configured to open the even order harmonic and to short the odd order harmonic at an output terminal of the power amplifier; and
an input matching network, configured to open the even order harmonic and to short the odd order harmonic at an input terminal of the power amplifier;
a harmonic feedback device, configured to inject the even order harmonic generated by the harmonic generator to the input terminal of the power amplifier; and
a harmonic eliminator, configured to eliminate the even order harmonic in the output signal of the power amplifier.

2. The apparatus according to claim 1, wherein,
the harmonic generating device comprises a nonlinear variable capacitor,
the harmonic feedback device comprises a linear capacitor,
the harmonic generating device is shunt to ground at the output terminal of the power amplifier,
the harmonic feedback device couples a gate and a drain of a power transistor of the power amplifier.

3. The apparatus according to claim 1, wherein,
the harmonic generator comprises a nonlinear capacitor Cds between a drain and a source of a power transistor of the power amplifier; and
the harmonic feedback device comprises a capacitor Cgd between a gate and the drain of the power transistor of the power amplifier; and the harmonic eliminator comprises a differential to single end network.

4. The apparatus according to claim 1, wherein the power amplifier is a Doherty amplifier, and the apparatus further comprises:
an impedance tuner controller, configured to generate a controlling signal according to power envelope of an input signal of the Doherty power amplifier;
an impedance tuner, configured to connect to output terminal of a carrier amplifier of the Doherty power amplifier, and an impedance of the impedance tuner is tuned according to the controlling signal; and
a timing alignment device, configured to compensate delay between the input signal and the controlling signal.

5. The apparatus according to claim 4, wherein, the impedance tuner controller comprises:
a power detector, configured to detect a level of the power;
a waveform shaping device, configured to generate a waveform of the controlling signal according to the level of the power; and
a tuner driver amplifier, configured to amplify the waveform and output the amplified controlling signal to the impedance tuner.

6. The apparatus according to claim 5, wherein,
a bandwidth of the tuner driver amplifier is at least 3 times of that of the power envelope of the input signal.

7. The apparatus according to claim 6, wherein,
the impedance tuner comprises at least one varactor stack,
an impedance of the impedance tuner is tuned by adjusting a ratio of a reactance and a resistance of the varactor stack.

8. The apparatus according to claim 4, wherein,
the impedance tuner is arranged in series with the carrier amplifier, the position of the impedance tuner is arranged in one of following three types:
a pre-tuning type, wherein a placement order is the carrier amplifier, the impedance tuner and an output matching network;
a post-tuning type, wherein the order is the carrier amplifier, the output matching network and the impedance tuner;
an integrated tuning type, wherein the impedance tuner is incorporated into the elements of the output matching network.

9. The apparatus according to claim 4, wherein,
when power level of an output of the power amplifier is lower than a 1st threshold, the impedance of the impedance tuner is fixed at a first static value;
when power level of the output of the power amplifier is higher than the 1st threshold and lower than a second threshold, the impedance of the impedance tuner is dynamically adjusted by the controlling signal according to optimum load impedance trajectory based on load pull measurements;
when power level of the output of the power amplifier enters Doherty operation, the impedance of the impedance tuner is fixed at a second static value;
when power level of the output of the power amplifier reaches a third threshold, the Doherty operation finishes and reach the maximum output power.

10. A method implemented at an apparatus, the method comprising:
generating even order harmonic according to an output signal of a power amplifier, wherein generating the even order harmonic comprises:
generating odd order harmonic and the even order harmonic according to the output signal of the power amplifier;
opening the even order harmonic and shorting the odd order harmonic at an output terminal of the power amplifier; and
opening the even order harmonic and shorting the odd order harmonic at an input terminal of the power amplifier;
injecting the even order harmonic to the input terminal of the power amplifier; and
eliminating the even order harmonic in the output signal of the power amplifier.

11. The method according to claim 10, wherein,
generating the odd order harmonic and the even order harmonic by using at least one nonlinear variable capacitor; and
injecting the generated harmonic by using linear capacitor.

12. The method according to claim 10, wherein, the power amplifier is a Doherty power amplifier,
the method further comprises:
generating a controlling signal according to power envelope of an input signal of the Doherty power amplifier;
tuning an impedance of an impedance tuner according to the controlling signal dynamically; and
compensating delay between the input signal and the controlling signal.

13. The method according to claim 12, wherein, generating controlling signal comprises:
detecting a level of the power;
generating a waveform of the controlling signal according to the level of the power;
amplifying the waveform and outputting the amplified controlling signal to the impedance tuner.

14. The method according to claim 12, wherein,
the impedance tuner comprises varactor stack,
an impedance of the impedance tuner is tuned by adjusting a ratio of a reactance and a resistance of the varactor stack.

15. The method according to claim 12, wherein,
when power level of an output of the power amplifier is lower than a 1st threshold, the impedance of the impedance tuner is fixed at a first static value;
when power level of the output of the power amplifier is higher than the 1st threshold and lower than the 2nd threshold, the impedance of the impedance tuner is adjusted by the controlling signal according to optimum load impedance trajectory based on load pull measurements;
when power level of the output of the power amplifier enters Doherty operation, the impedance of the impedance tuner is fixed at a second static value;
when power level of the output of the power amplifier reaches a third threshold, the Doherty operation finishes and reach the maximum output power.

* * * * *